(12) United States Patent
Kim et al.

(10) Patent No.: US 9,240,512 B2
(45) Date of Patent: Jan. 19, 2016

(54) IMAGE SENSORS HAVING TRANSFER GATE ELECTRODES IN TRENCH

(71) Applicants: Sungchul Kim, Hwaseong-si (KR); Hyoungsoo Ko, Hwaseong-si (KR); Wonjoo Kim, Hwaseong-si (KR); Jung Bin Yun, Hwaseong-si (KR); Kwang-Min Lee, Seoul (KR)

(72) Inventors: Sungchul Kim, Hwaseong-si (KR); Hyoungsoo Ko, Hwaseong-si (KR); Wonjoo Kim, Hwaseong-si (KR); Jung Bin Yun, Hwaseong-si (KR); Kwang-Min Lee, Seoul (KR)

(73) Assignee: Samsung Electronics Co., Ltd. (KR)

(*) Notice: Subject to any disclaimer, the term of this patent is extended or adjusted under 35 U.S.C. 154(b) by 4 days.

(21) Appl. No.: 14/330,378

(22) Filed: Jul. 14, 2014

(65) Prior Publication Data

US 2015/0115291 A1     Apr. 30, 2015

(30) Foreign Application Priority Data

Oct. 31, 2013   (KR) .................... 10-2013-0131345

(51) Int. Cl.
   *H01L 31/16*        (2006.01)
   *H01L 27/146*       (2006.01)

(52) U.S. Cl.
   CPC ............ *H01L 31/16* (2013.01); *H01L 27/1464* (2013.01); *H01L 27/14603* (2013.01); *H01L 27/14605* (2013.01); *H01L 27/14607* (2013.01); *H01L 27/14614* (2013.01); *H01L 27/14621* (2013.01); *H01L 27/14627* (2013.01); *H01L 27/14645* (2013.01); *H01L 27/14687* (2013.01); *H01L 27/14689* (2013.01)

(58) Field of Classification Search
   CPC ... H01L 27/14; H01L 27/146; H01L 31/0312; H01L 31/062; H01L 31/10; H01L 31/112; H01L 31/113; H01L 31/18
   See application file for complete search history.

(56) References Cited

U.S. PATENT DOCUMENTS

| | | | |
|---|---|---|---|
| 7,626,685 B2 | 12/2009 | Jin et al. | |
| 7,671,391 B2 | 3/2010 | Kawahito | |
| 8,247,854 B2 | 8/2012 | Kang | |
| 8,314,924 B2 | 11/2012 | Bamji et al. | |
| 8,513,709 B2 | 8/2013 | Jin et al. | |
| 8,519,456 B2 | 8/2013 | Masagaki et al. | |
| 2007/0158770 A1* | 7/2007 | Kawahito ..................... 257/431 |
| 2009/0303371 A1 | 12/2009 | Watanabe et al. | |
| 2012/0199882 A1 | 8/2012 | Shin | |
| 2014/0103412 A1* | 4/2014 | Lee et al. ..................... 257/292 |

FOREIGN PATENT DOCUMENTS

JP     2011-215073     10/2011
KR     20130007121 A    1/2013

* cited by examiner

*Primary Examiner* — Fernando L Toledo
*Assistant Examiner* — Lawrence-Linh T Nguyen
(74) *Attorney, Agent, or Firm* — Myers Bigel Sibley & Sajovec, P.A.

(57) ABSTRACT

Provided is an image sensor including a semiconductor substrate having a trench and having a first conductivity type, a photoelectric conversion layer formed in the semiconductor substrate below the trench to have a second conductivity type, first and second transfer gate electrodes provided in the trench covered with a gate insulating layer, a first charge-detection layer formed in the semiconductor substrate adjacent to the first transfer gate electrode, and a second charge-detection layer formed in the semiconductor substrate adjacent to the second transfer gate electrode.

20 Claims, 29 Drawing Sheets

FIG. 8

| G | R | G | R |
|---|---|---|---|
| B | Z | B | Z |
| G | R | G | R |
| B | Z | B | Z |

IMAGE SENSORS HAVING TRANSFER GATE ELECTRODES IN TRENCH

CROSS-REFERENCE TO RELATED APPLICATION

This U.S. non-provisional patent application claims priority under 35 U.S.C. §119 to Korean Patent Application No. 10-2013-0131345, filed on Oct. 31, 2013 in the Korean Intellectual Property Office, the disclosure of which is hereby incorporated herein in its entirety by reference.

BACKGROUND

The present disclosure relates to an image sensor, and in particular, to an image sensor capable of realizing a three-dimensional image. An image sensor is a device that converts optical images into electrical signals. There is an increased demand for high performance image sensors in a variety of applications such as, for example, digital cameras, camcorders, personal communication systems, gaming machines, security cameras, micro-cameras for medical applications, and/or robots. In addition, image sensors for realizing three-dimensional and/or color images are recently being developed.

SUMMARY

Example embodiments of the inventive concepts may provide an image sensor that is capable of realizing a three-dimensional image with improved resolution.

According to example embodiments of the inventive concepts, an image sensor may include a semiconductor substrate having a trench and having a first conductivity type, a photoelectric conversion layer formed in the semiconductor substrate below the trench to have a second conductivity type that is opposite the first conductivity type, first and second transfer gate electrodes that are each at least partly in the trench, a gate insulating layer that is at least partly in the trench and that is interposed between the first and second transfer gate electrodes and the photoelectric conversion layer, a first charge-detection layer in the semiconductor substrate adjacent to the first transfer gate electrode, and a second charge-detection layer in the semiconductor substrate adjacent to the second transfer gate electrode.

In example embodiments, the trench us in a top surface of the semiconductor substrate, and bottom surfaces of the first and second transfer gate electrodes may be closer to a bottom surface of the semiconductor substrate than are bottom surfaces of the first and second charge-detection layers.

In example embodiments, the trench may extend vertically into the semiconductor substrate and the first and second transfer gate electrodes may extend further through the semiconductor substrate in the vertical direction than do the first and second charge-detection layers.

In example embodiments, the first and second transfer gate electrodes may overlap the photoelectric conversion layer, when viewed in plan view.

In example embodiments, a space between the first and second transfer gate electrodes may be smaller than a width of the first transfer gate electrode.

In example embodiments, the trench may be in the top surface of the semiconductor substrate, and the image sensor may further comprise an interconnection layer on the top surface of the semiconductor substrate to include a plurality of wires, and an optical filter layer on the bottom surface of the semiconductor substrate.

According to example embodiments of the inventive concepts, an image sensor may include a semiconductor substrate having a first conductivity type, the semiconductor substrate including a color pixel region and a depth pixel region, a first photoelectric conversion layer in the color pixel region of the semiconductor substrate, the first photoelectric conversion layer having a second conductivity type that is opposite the first conductivity type, a color pixel transfer gate electrode on the first photoelectric conversion layer, a second photoelectric conversion layer in the depth pixel region of the semiconductor substrate, the second photoelectric conversion layer having the second conductivity type, first and second depth pixel transfer gate electrodes on the second photoelectric conversion layer, a first charge-detection layer in the semiconductor substrate at a side of the first depth pixel transfer gate electrode that is opposite the second depth pixel transfer gate electrode, and a second charge-detection layer at a side of the second depth pixel transfer gate electrode that is opposite the first depth pixel transfer gate electrode. The color pixel transfer gate electrode may be at least partly in a first trench in a top surface of the semiconductor substrate.

In example embodiments, at least one of the first and second depth pixel transfer gate electrodes is at least partly in a second trench in the top surface of the semiconductor substrate.

In example embodiments, bottom surfaces of the first and second charge-detection layers may be closer to the top surface of the semiconductor substrate than are bottom surfaces of the first and second depth pixel transfer gate electrodes.

In example embodiments, the color pixel transfer gate electrode may have a top surface that is substantially coplanar with top surfaces of the first and second depth pixel transfer gate electrodes.

In example embodiments, the color pixel transfer gate electrode may be disposed above and cover a central region of the first photoelectric conversion layer.

In example embodiments, the image sensor may further include a charge-detection layer in the semiconductor substrate at a side of the color pixel transfer gate electrode, the charge-detection layer having the second conductivity type.

In example embodiments, the first and second depth pixel transfer gate electrodes may be disposed above and at least partly cover the second photoelectric conversion layer.

In example embodiments, a distance between the first and second depth pixel transfer gate electrodes may be smaller than a width of the first depth pixel transfer gate electrode.

In example embodiments, a width of the color pixel transfer gate electrode may be smaller than widths of each of the first and second depth pixel transfer gate electrodes.

In example embodiments, a first vertical depth of the first photoelectric conversion layer may be different than a second vertical depth of the second photoelectric conversion layer.

In example embodiments, the image sensor may further include an interconnection layer provided on the top surface of the semiconductor substrate to include a plurality of vertically-stacked wires, and an optical filter layer provided on the bottom surface of the semiconductor substrate.

In example embodiments, the optical filter layer may include a first optical filter layer that passes visible light on the color pixel region, and a second optical filter layer that passes infrared light on the depth pixel region.

According to example embodiments of the inventive concepts, an image sensor system may include a light source that is configured to emit light toward an object, an image sensor that is configured to sense light reflected from the object, and a timing controller that is configured to provide synchronized pulse signals to the light source and the image sensor. The image sensor may include a semiconductor substrate having a trench in a top surface thereof, first and second transfer gate electrodes in the trench, a photoelectric conversion layer in the semiconductor substrate below the first and second transfer gate electrodes, a first charge-detection layer in the semiconductor substrate adjacent to the first transfer gate electrode, and a second charge-detection layer in the semiconductor substrate adjacent to the second transfer gate electrode.

In example embodiments, the timing controller may be configured to provide first and second pulse signals, which have a phase difference of 180 degrees, to the first and second transfer gate electrodes, respectively, and the image sensor system may be configured to calculate a distance from the light source to the object, based on a difference in electric potential between the first and second charge-detection layers.

In example embodiments, the image sensor may be configured so that electric fields induced by the first and second transfer gate electrodes are separated from each other, when the first and second transfer signals are applied thereto.

According to additional example embodiments of the inventive concepts, an image sensor is provided that includes a semiconductor substrate having a top surface and a bottom surface, first and second charge-detection layers in the semiconductor substrate, a trench that is vertically recessed in a top surface of the semiconductor substrate between the first and second charge-detection layers, first and second transfer gate electrodes in the trench, the first and second transfer gate electrodes laterally spaced apart from each other and between the first and second charge-detection layers, and a photoelectric conversion layer in the semiconductor substrate under the first and second transfer gate electrodes. A top surface of the photoelectric conversion layer is closer to the bottom surface of the semiconductor substrate than are bottom surfaces of the first and second charge-detection layers.

In example embodiments, the image sensor may further include a gate insulating layer on sidewalls of the trench.

In example embodiments, the trench may be a first trench and a second trench that is adjacent the first trench, and the first transfer gate electrode may be in the first trench and the second transfer gate electrode may be in the second trench.

In example embodiments, at least a portion of a sidewall of the first transfer gate electrode may be slanted with respect to a plane that extends perpendicularly through the top surface of the semiconductor substrate.

In example embodiments, a bottom surface of the trench may be closer to the bottom surface of the semiconductor substrate than are bottom surfaces of the first and second charge-detection layers.

BRIEF DESCRIPTION OF THE DRAWINGS

Example embodiments will be more clearly understood from the following detailed description taken in conjunction with the accompanying drawings. The accompanying drawings represent non-limiting, example embodiments as described herein. In the drawings:

FIG. 8 is a schematic plan view illustrating a sensor array of an image sensor according to further example embodiments of the inventive concepts.

Figure 1:
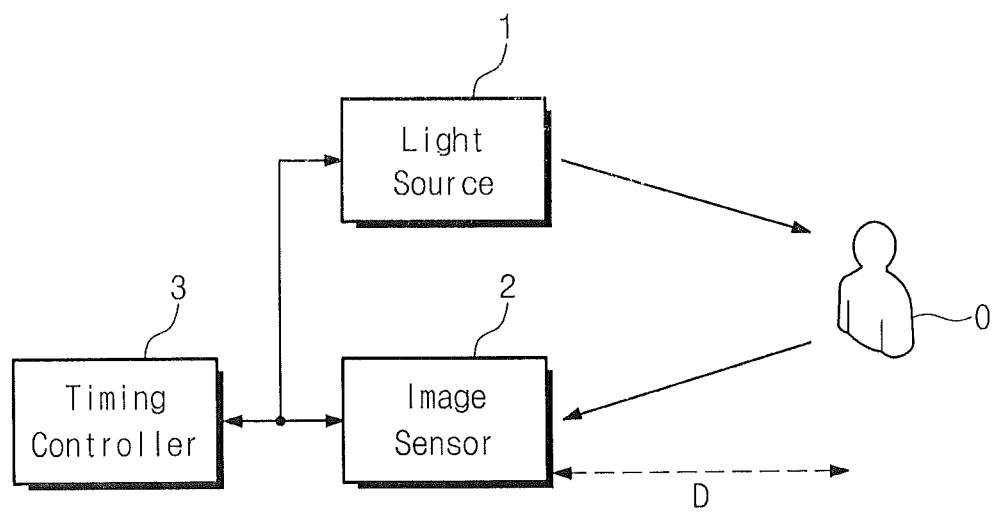
FIG. 1 is a schematic diagram illustrating an image sensor system according to example embodiments of the inventive concepts.

The above figures illustrate the general characteristics of methods, structures and/or materials utilized in certain example embodiments and supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

The image sensors described herein may be embodied in microelectronic devices such as integrated circuits, where a plurality of the devices are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

FIG. 1 is a schematic diagram illustrating an image sensor system according to example embodiments of the inventive concepts.

Referring to FIG. 1, an image sensor system according to example embodiments of the inventive concepts may be configured to irradiate light onto an object O, sense light reflected from the object O, and calculate an optical depth or distance to the object O. The image sensor system may include a light source 1 configured to irradiate light onto the object O, an image sensor 2 that is configured to sense light reflected from the object O and a timing controller 3 that is configured to synchronize the light source 1 and the image sensor 2.

The light source 1 may emit a pulsed optical signal onto the object O. In example embodiments, the light source 1 may be configured to emit infrared, microwave, and/or visible light. For example, a light emitting diode (LED), a laser diode (LD) and/or an organic light emitting diode (OLED) may be used for the light source 1.

The image sensor 2 may be configured to detect light reflected from the object O and output optical depth information regarding the object O. The optical depth information may be used to realize a three-dimensional imaging device. The image sensor 2 may have both depth pixels and visible light pixels.

The timing controller 3 may control operations of the light source 1 and the image sensor 2. For example, the timing controller 3 may be configured to synchronize the timing of the light that is output by the light source 1 and the operational timing of the image sensor 2.

Figure 2:
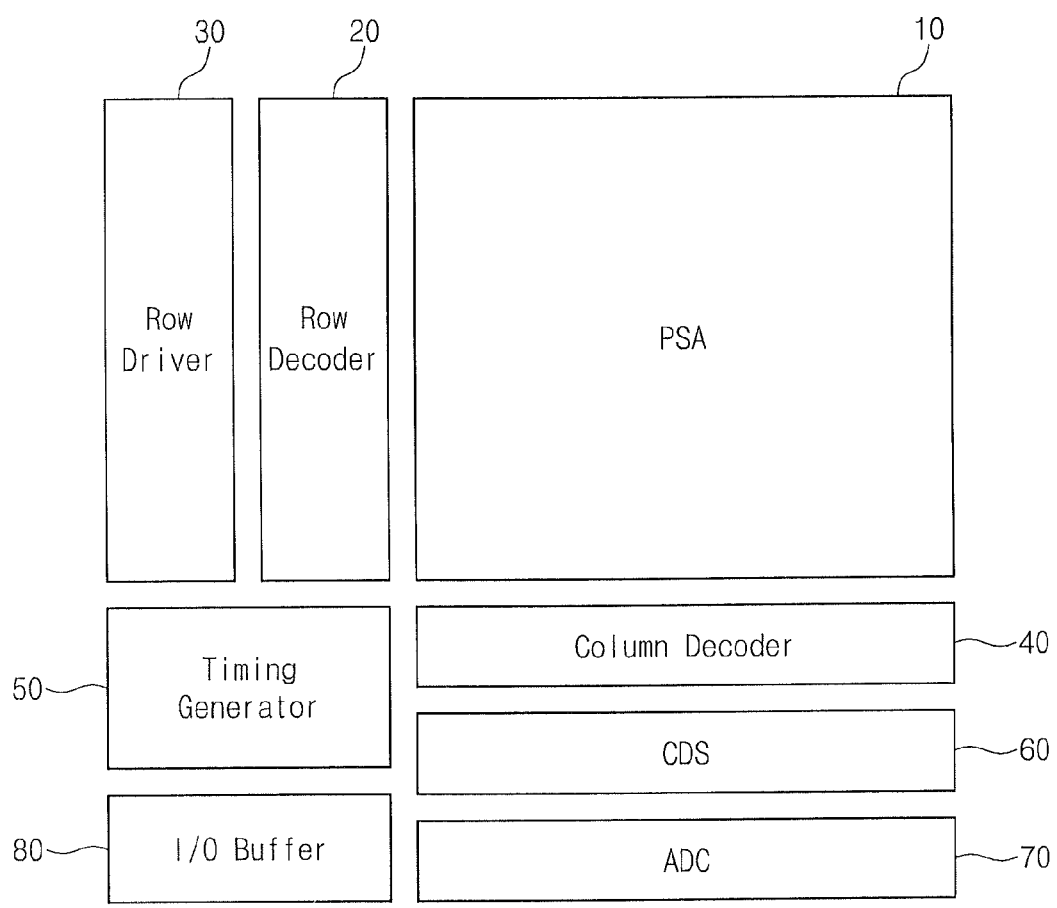
FIG. 2 is a block diagram of an image sensor according to example embodiments of the inventive concepts.

FIG. 2 is a block diagram of an image sensor according to example embodiments of the inventive concepts.

Referring to FIG. 2, an image sensor may include an active pixel sensor array (PSA) 10, a row decoder 20, a row driver 30, a column decoder 40, a timing generator 50, a correlated double sampler (CDS) 60, an analog-to-digital converter (ADC) 70, and an input/output (I/O) buffer 80.

In example embodiments, the pixel sensor array 10 may include a plurality of two-dimensionally arranged depth pixels. The pixel sensor array 10 may also include a plurality of color pixels. The pixel sensor array 10 may be driven by a plurality of driving signals, such as a pixel selection signal, a reset signal, and a charge transmission signal, which are transmitted from the row driver 30 to the pixel sensor array 10. The electrical signals that are generated in the pixel sensor array 10 may be provided to the correlated double sampler 60.

The row driver 30 may provide several driving signals for driving several unit pixels to the pixel sensor array 10 in accordance with the decoded result obtained from the row decoder 20. In the case where the unit pixels are arranged in a matrix shape, the driving signals may be supplied to the respective rows.

The timing generator 50 may provide timing and control signals to the row decoder 20 and the column decoder 40.

The correlated double sampler 60 may receive the electric signals generated by the pixel sensor array 10, and may hold and sample the received electric signals. The correlated double sampler 60 may perform a double sampling operation of a noise level and a signal level of the electric signal to output a difference level corresponding to a difference between the noise and signal levels.

The analog-to-digital converter 70 may convert analog signals corresponding to the difference level output from the correlated double sampler 60 into digital signals, and then output the converted digital signals.

The I/O buffer 80 may latch the digital signals and then output the latched digital signals sequentially to an image signal processing unit (not shown) in accordance with the decoding result obtained from the column decoder 40.

Figure 3:
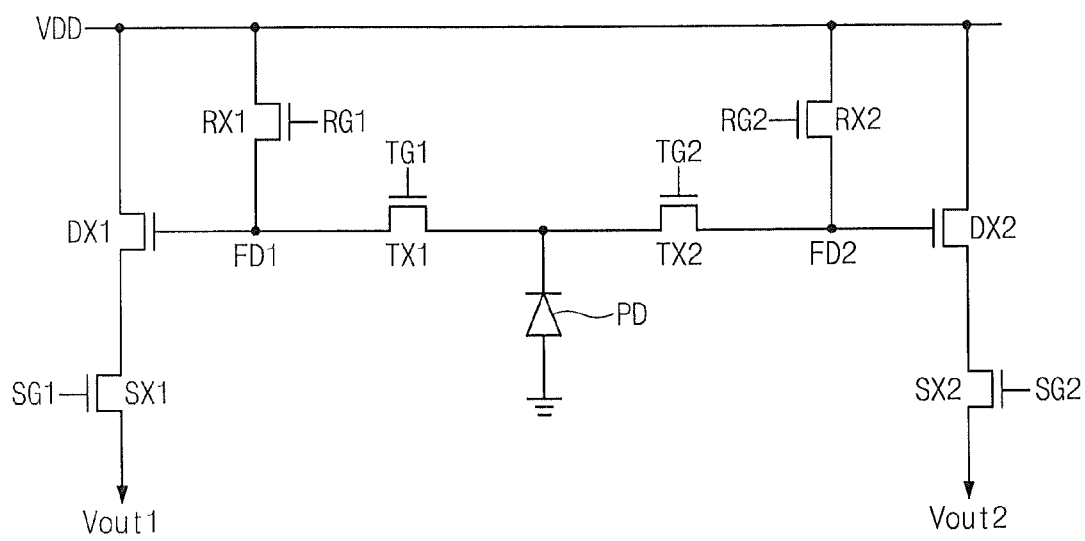
FIG. 3 is a circuit diagram of a depth pixel in an image sensor according to example embodiments of the inventive concepts.

FIG. 3 is a circuit diagram of a depth pixel of an image sensor according to example embodiments of the inventive concepts.

Referring to FIG. 3, each depth pixel may include a photoelectric conversion device PD, a first reading device, and a second reading device.

The photoelectric conversion device PD may generate and store electric charges from incident light. The light incident into the depth pixel may be light reflected from an object, as described above with reference to FIG. 1. In the depth pixel, the photoelectric conversion device PD may be connected in common to the first and second reading devices. The photoelectric conversion device PD may be provided in the form of, for example, a photo diode, a photo transistor, a photo gate, a pinned photo diode, or any combination thereof. For the sake of simplicity, the description that follows will refer to an example of the present embodiment in which a photo diode is used as the photoelectric conversion device PD.

The first reading device may include a first transfer transistor TX1, a first reset transistor RX1, a first drive transistor DX1, and a first selection transistor SX1. The second reading device may include a second transfer transistor TX2, a second reset transistor RX2, a second drive transistor DX2, and a second selection transistor SX2.

The first transfer transistor TX1 may be controlled by a first transfer signal TG1, and the second transfer transistor TX2 may be controlled by a second transfer signal TG2. The first transfer signal TG1 may be configured to have a phase that is offset by 180 degrees from that of the second transfer signal TG2. The charges generated in the photoelectric conversion device PD may be transmitted to first and second charge-detection nodes FD1 and FD2 through the first and second transfer transistors TX1 and TX2, respectively. The transmitted charges may be stored or accumulated in the first and second charge-detection nodes FD1 and FD2 to control operations of the first and second drive transistors DX1 and DX2.

The first and second reset transistors RX1 and RX2 may discharge charges periodically from the first and second charge-detection nodes FD1 and FD2, respectively. The source electrodes of the first and second reset transistors RX1 and RX2 may be connected to the first and second charge-detection nodes FD1 and FD2, respectively, and drain electrodes thereof may be connected to a power voltage terminal that is supplied with a power voltage VDD. The first and second reset transistors RX1 and RX2 may be driven by voltages applied to first and second reset signals RG1 and RG2, respectively. In the case where the first reset transistor RX1 is turned on by the first reset signal RG1, the power voltage VDD may be applied to the first charge-detection node FD1 through the first reset transistor RX1 to discharge the charges from the first charge-detection node FD1. Similarly, in the case where the second reset transistor RX2 is turned on by the second reset signal RG2, the power voltage VDD may be applied to the second charge-detection node FD2 through the second reset transistor RX2, thereby discharging the charges from the second charge-detection node FD2.

The first and second drive transistors DX1 and DX2 may serve as source follower buffer amplifiers amplifying signals associated with charges stored in the first and second charge-detection nodes FD1 and FD2.

The first and second selection transistors SX1 and SX2 may be controlled by first and second selection signals SG1 and SG2. In the case where the first and second selection transistors SX1 and SX2 are turned on, signals amplified by the first and second drive transistors DX1 and DX2 may be output to an external device (e.g., the image signal processing unit) through first and second output lines Vout1 and Vout2. In the image signal processing unit, the signals output from the first and second output lines Vout1 and Vout2 may be used to obtain depth information regarding the object.

Figure 4:
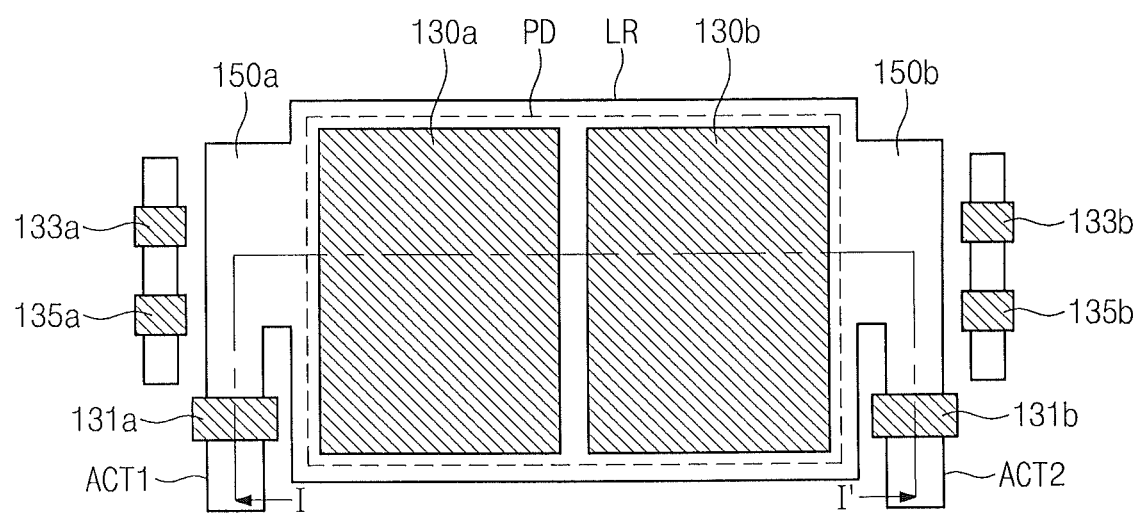
FIG. 4 is a schematic plan view of a depth pixel in an image sensor according to example embodiments of the inventive concepts.
Figure 5:
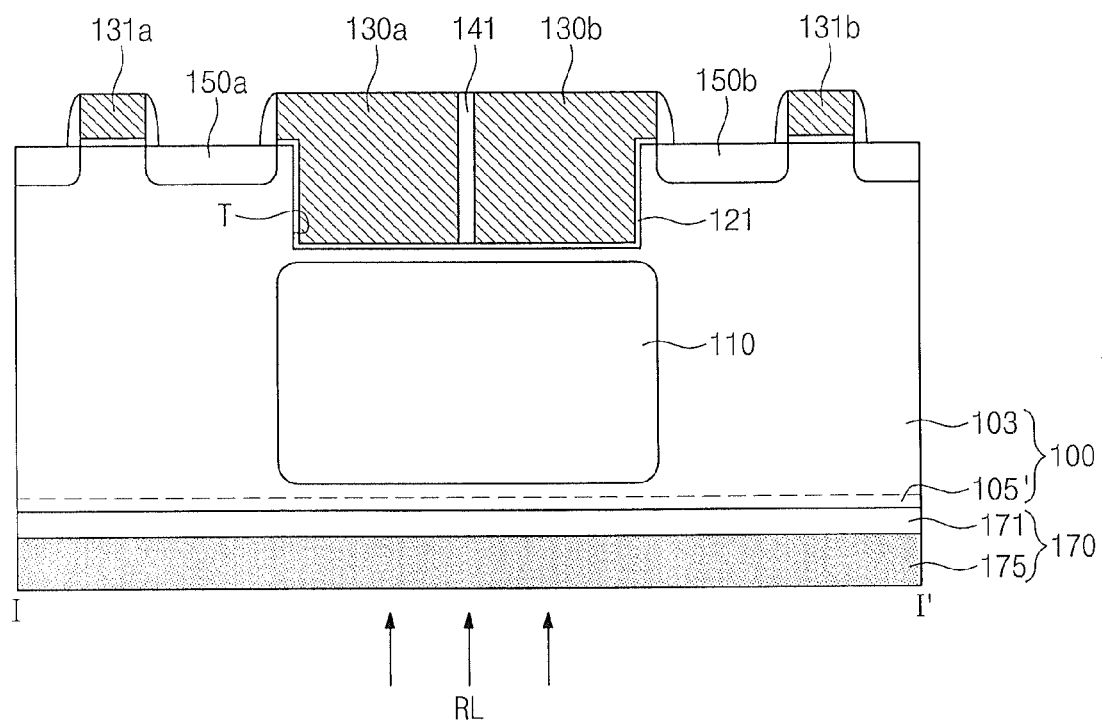
FIG. 5 is a sectional view taken along line I-I' of FIG. 4.

FIG. 4 is a schematic plan view of a depth pixel in an image sensor according to example embodiments of the inventive concepts. FIG. 5 is a sectional view taken along line I-I' of FIG. 4.

Referring to FIGS. 4 and 5, a semiconductor substrate 100 may have a first conductivity type and have a top surface and a bottom surface.

In example embodiments, the semiconductor substrate 100 may be formed of a p-type epitaxial layer 103 and a highly-doped p-type layer 105'. The highly-doped p-type layer 105' may form the bottom surface of the semiconductor substrate 100. The highly-doped p-type layer 105' may have a p-type impurity concentration that is higher than that of the p-type epitaxial layer 103. The highly-doped p-type layer 105' may help reduce or prevent electric potential at the bottom surface of the semiconductor substrate 100 from being lowered by defects (such as dangling bonds of silicon or surface defects or interface traps caused by etching stress) and to reduce the likelihood of a depletion well being formed. In example embodiments, the surface of the p-type epitaxial layer 103 that is farthest from the highly-doped p-type layer 105' may be defined as the top surface of the semiconductor substrate 100, and the surface of the highly-doped p-type layer 105' that is opposite the p-type epitaxial layer 103 may be defined as the bottom surface of the semiconductor substrate 100. In other embodiments, the semiconductor substrate 100 may be a bulk wafer with a p-type impurity well.

The semiconductor substrate 100 may include an active region that is defined by a device isolation layer (not shown).

In example embodiments, the active region may include a light-receiving region LR, to which light is incident, and first and second logic active regions ACT1 and ACT2 for the first and second reading devices. The light-receiving region LR may be disposed between the first and second logic active regions ACT1 and ACT2. The shapes and positions of the light-receiving region LR and the first and second logic active regions ACT1 and ACT2 are not be limited to the above-described examples.

In example embodiments, a photoelectric conversion layer 110 may be formed in the light-receiving region LR of the semiconductor substrate 100. In example embodiments, the photoelectric conversion layer 110 may include an n-type region that is formed in the semiconductor substrate 100 to constitute a photodiode along with the p-type semiconductor substrate 100. In the case where light is incident into the n-type region of the photoelectric conversion layer 110, charges may be generated and stored therein.

Further, in the light-receiving region LR, the semiconductor substrate 100 may have a trench T formed therein. The trench T may be formed by anisotropically etching a portion of the top surface of the semiconductor substrate 100. The photoelectric conversion layer 110 may be formed in the semiconductor substrate 100 below the trench T.

First and second transfer gate electrodes 130a and 130b may be provided in the trench T with a gate insulating layer 121 interposed between the substrate 100 and the first and second transfer gate electrodes 130a, 130b. The first and second transfer gate electrodes 130a and 130b may be spaced apart from each other in the trench T, and an inter-gate insulating layer 141 may be interposed between the first and second transfer gate electrodes 130a and 130b. A width of the first transfer gate electrode 130a may be smaller than about ½ of a width of the trench T, and the width of the first transfer gate electrode 130a may be substantially the same as a width of the second transfer gate electrode 130b. Further, a space between the first and second transfer gate electrodes 130a and 130b may be smaller than the width of each of the first and second transfer gate electrodes 130a and 130b. When viewed in plan view, the first and second transfer gate electrodes 130a and 130b may at least partially cover the photoelectric conversion layer 110.

In example embodiments, a first charge-detection layer 150a may be disposed at a side of the first transfer gate electrode 130a that is opposite the second transfer gate electrode 130b, and a second charge-detection layer 150b may be disposed at a side of the second transfer gate electrode 130b that is opposite the first transfer gate electrode 130a. When viewed in plan view, the photoelectric conversion layer 110 and the first and second transfer gate electrodes 130a, 130b may be disposed between the first and second charge-detection layers 150a and 150b.

The first and second charge-detection layers 150a and 150b may store charges that are transmitted through the first and second transfer gate electrodes 130a and 130b. The first and second charge-detection layers 150a and 150b may be formed by doping the semiconductor substrate 100 with n-type impurities. An n-type impurity concentration of the first and second charge-detection layers 150a and 150b may be higher than the n-type impurity concentration of the photoelectric conversion layer 110. In example embodiments, the first and second charge-detection layers 150a and 150b may be formed to have bottom surfaces that are at different distances above the bottom surface of the semiconductor substrate 100 than are bottom surfaces of the first and second transfer gate electrodes 130a and 130b. For example, a vertical depth from the top surface of the semiconductor substrate 100 to the first and second charge-detection layers 150a and 150b may be smaller than a vertical depth of the trench T from the top surface of the semiconductor substrate 100. Here, the vertical depth of the first and second charge-detection layers 150a and 150b may be referred to as a distance between the top surface of the semiconductor substrate 100 and the bottom surfaces of the first and second charge-detection layers 150a and 150b.

The first reset transistor RX1 may include a first reset gate electrode 131a, which may be disposed on the top surface of the semiconductor substrate 100 and which may be spaced apart from the first transfer gate electrode 130a. The first charge-detection layer 150a may be formed in a portion of the semiconductor substrate 100 that is located between the first reset gate electrode 131a and the first transfer gate electrode 130a. The second reset transistor RX2 may include a second reset gate electrode 131b, which may be disposed on the top surface of the semiconductor substrate 100 and which may be spaced apart from the second transfer gate electrode 130b. The second charge-detection layer 150b may be formed in a portion of the semiconductor substrate 100 that is located between the second transfer gate electrode 130b and the second reset gate electrode 131b.

The first drive transistor DX1 and the first selection transistor SX1 may be provided in the first logic active region ACT1. For example, a first drive gate electrode 133a and a first selection gate electrode 135a may be provided in the first logic active region ACT1, and source/drain impurity regions may be formed in portions of the first logic active region ACT1 that are not covered with the first drive gate electrode 133a and the first selection gate electrode 135a.

The second drive transistor DX2 and the second selection transistor SX2 may be provided in the second logic active region ACT2. For example, a second drive gate electrode 133b and a second selection gate electrode 135b may be disposed in the second logic active region ACT2, and source/drain impurity regions may be formed in portions of the second logic active region ACT2 that are not covered with the second drive gate electrode 133b and the second selection gate electrode 135b.

In the image sensor according to example embodiments of the inventive concepts, an optically-transparent layer 170 may be provided on the bottom surface of the semiconductor substrate 100. The optically-transparent layer 170 may include a planarization layer 171 and an optical filter layer 175. Furthermore, although not shown, the optically-transparent layer 170 may further include a microlens that concentrates incident light. Since the optically-transparent layer 170 is disposed on the bottom surface of the semiconductor substrate 100, light RL can be incident into the photoelectric conversion layer 110 through the bottom surface of the semiconductor substrate 100 and generate electric charges in the photoelectric conversion layer 110.

For example, the planarization layer 171 may be disposed between the bottom surface of the semiconductor substrate 100 and the optical filter layer 175. The planarization layer 171 may be formed of a material, whose refractive index is higher than that of silicon oxide, and this may make it possible to improve the light sensitivity of the image sensor. For example, the planarization layer 171 may be formed of a material having a refractive index ranging from about 1.4 to about 4.0. In example embodiments, the planarization layer 171 may be formed of $Al_2O_3$, $CeF_3$, $HfO_2$, ITO, MgO, $Ta_2O_5$, $TiO_2$, $ZrO_2$, Si, Ge, ZnSe, ZnS, or $PbF_2$. In other embodiments, the planarization layer 171 may be formed of an organic material with a high refractive index, for example, siloxane resin, benzocyclobutene (BCB), polyimide materials, acrylic materials, parylene C, poly (methyl methacrylate) (PMMA), or polyethylene terephthalate (PET). Further, the planarization layer 171 may be formed of or include, for example, strontium titanate ($SrTiO_3$), polycarbonate, glass, bromine, sapphire, cubic zirconia, potassium Niobate ($KNbO_3$), silicon carbide (SiC), gallium (III) phosphide (GaP), or gallium (III) arsenide (GaAs).

The optical filter layer 175 may allow light with a specific wavelength range to pass therethrough. For example, the optical filter layer 175 may be configured to allow an infrared light from an external source to propagate toward the depth pixel. The optical filter layer 175 may further be configured to prevent other types of light such as visible light and ultraviolet light from passing into the depth pixel.

Figure 6:
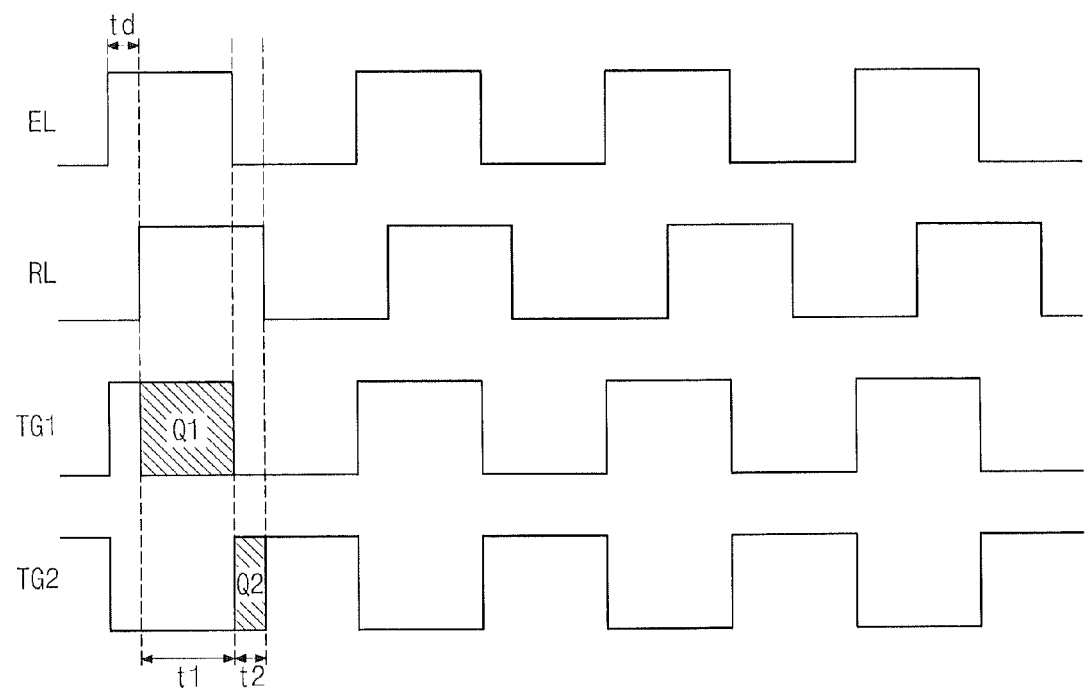
FIG. 6 is a timing diagram illustrating the operation of a depth pixel in an image sensor according to example embodiments of the inventive concepts.
Figure 7:
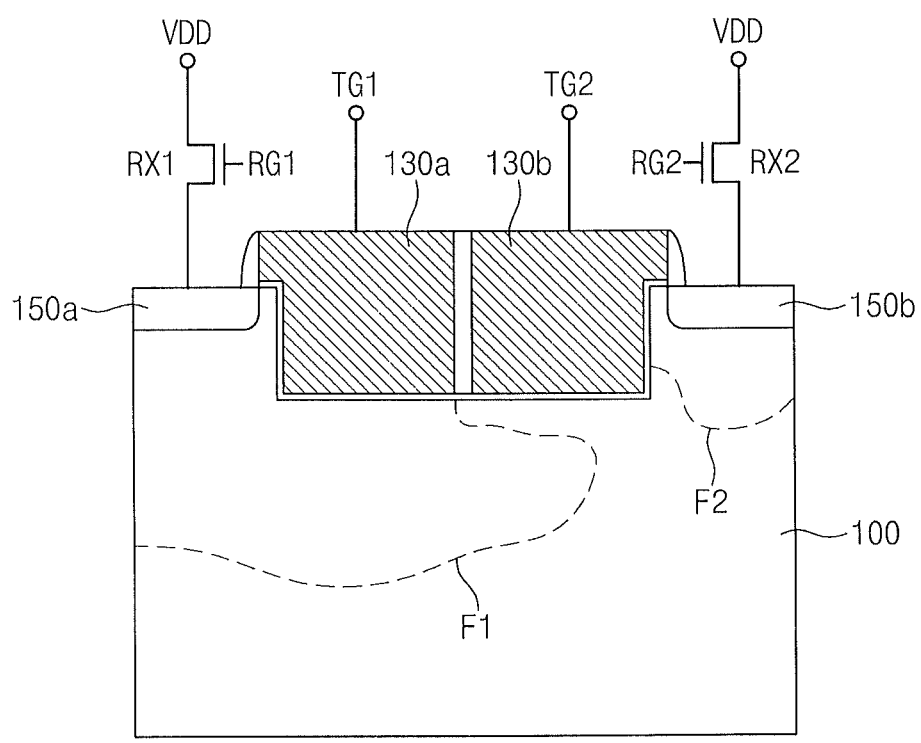
FIG. 7 is a sectional diagram illustrating a profile of electric potential during operation of an image sensor according to example embodiments of the inventive concepts.

FIG. 6 is a timing diagram illustrating the operation of a depth pixel in an image sensor according to example embodiments of the inventive concepts. FIG. 7 is a sectional diagram illustrating a profile of electric potential in the image sensor during operation.

Referring to FIGS. 1, 6 and 7, a pulsed optical signal EL may be emitted from the light source 1 onto the object. Although the pulsed optical signal EL has a rectangular pulsed waveform in the example of FIG. 6, it will be appreciated that in other embodiments the pulsed waveform may have a different shape such as, for example, a sinusoidal wave.

A fraction of the optical signal EL may be reflected by the object to form a reflected light RL that is incident into the depth pixel. The reflected light RL is delayed with respect to the optical signal EL. When the optical signal EL is incident onto the object, the first transfer signal TG1 may be applied to the first transfer gate electrode 130a in synchronization with the optical signal EL, and the second transfer signal TG2, which has a phase difference of 180 degrees with respect to the first transfer signal TG1, may be applied to the second transfer gate electrode 130b. In other words, the first and second transfer signals TG1 and TG2 may be alternatingly activated. For example, when a high voltage is applied to the first transfer gate electrode 130a, a low voltage may be applied to the second transfer gate electrode 130b.

In detail, if a high voltage portion of the first transfer signal TG1 is applied to the first transfer gate electrode 130a, photocharges generated in the photoelectric conversion layer 110 may be transferred to the first charge-detection layer 150a. The photocharges stored in the first charge-detection layer 150a may be output in the form of an electrical signal through the first reading device. Similarly, if a high voltage portion of the second transfer signal TG2 is applied to the second transfer gate electrode 130b, photocharges generated in the photoelectric conversion layer 110 may be transferred to the second charge-detection layer 150b. The photocharges stored in the second charge-detection layer 150b may be output in the form of an electrical signal through the second reading device.

The quantities of electric charges that are output from the respective first and second charge-detection layers 150a and 150b will vary depending on the lengths of time that the reflected light RL is incident on the image sensor and the first and second transfer signals TG1 and TG2 are activated. For example, a delay time, td, which represents the delay between the activation of the optical signal EL and the reflected light RL being incident on the image sensor, may be calculated from a difference between the charge quantities Q1 and Q2 that are stored in the first and second charge-detection layers 150a and 150b, respectively. The charge quantity Q1 is based on a length of time t1 during which EL and RL are both in their high positions in FIG. 6, and the charge quantity Q2 is based on the length of time t2 during which EL is in its low position in FIG. 6 and RL is in its high position. In other words, a difference between the signals that are output from the first and second charge-detection layers 150a and 150b, which represent the charges that were stored in those layers, may be used to calculate a distance or optical depth between the light source and the object. In detail, the distance D (e.g., of FIG. 1) between the light source and the object may be obtained using the relation td=2D/c, where c is the velocity of light.

The larger the difference between the signals output from the first and second reading devices, the higher the exactness of the optical depth of the object and the better a demodulation contrast (DC) property of the depth pixel. Here, the DC property may be generally given by dividing a difference between signals output from the first and second reading devices by a sum of the signals output from the first and second reading devices. This means that the larger the difference between the signals output from the first and second reading devices, the less the loss of electric charges transferred from the photoelectric conversion layer 110 to the first or second charge-detection layer 150a or 150b.

According to example embodiments of the inventive concepts, during operation of the image sensor, a high voltage (e.g., a voltage of about 2.5V to 3V) may be applied to the first transfer gate electrode 130a and a low voltage (e.g., of about 0V to 1.5V) may be applied to the second transfer gate electrode 130b. In this case, electric potential in the semiconductor substrate 100 may have a profile such as the profile shown in FIG. 7. At the same time, a static voltage (e.g., of about 2.5V to 3.0V) may be applied to the first and second charge-detection layers 150a and 150b. Accordingly, a static field may be induced in regions of the semiconductor substrate 100 adjacent to the first and second charge-detection layers 150a and 150b.

A high voltage applied to the first transfer gate electrode 130a may lead to a non-vanishing gradient in electric potential of the photoelectric conversion layer 110, and thus, charges produced in the photoelectric conversion layer 110 may be transferred toward the first charge-detection layer 150a. During the operation of detecting the charges transferred to the first charge-detection layer 150a, a fraction of charges produced in the photoelectric conversion layer 110 may be transferred into the second charge-detection layer 150b, due to the presence of an electrostatic field produced by the second charge-detection layer 150b. This phenomenon may intensify as the distance between the second charge-detection layer 150b and the first transfer gate electrode 130a is reduced.

According to example embodiments of the inventive concepts, since the first and second transfer gate electrodes 130a and 130b are formed in the trench, an effective distance between the first transfer gate electrode 130a and the second charge-detection layer 150b may be increased. Thus, during the operation of detecting electric charges from the first charge-detection layer 150a, an electric field F1 that is induced by application of the high voltage to the first transfer gate electrode 130a may not connect to an electric field F2 that is induced by application of the static voltage to the second charge-detection layer 150b. Accordingly, it is possible to suppress the number of charges produced in the photoelectric conversion layer 110 that move into the second charge-detection layer 150b during the operation of detecting electric charges from the first charge-detection layer 150a. In other words, it is possible to selectively enhance the electric field F1 that is induced by application of the high voltage to the first transfer gate electrode 130a and to suppress the electric field F2 that is induced by application of the static voltage to the second charge-detection layer 150b during the operation of detecting electric charges from the first charge-detection layer 150a. As a result, it is possible to reduce or prevent the electric fields F1 and F2 from being mixed during the operation of detecting electric charges from the first charge-detection layer 150a, and this makes it possible to improve the precision of the charge detecting operation and improve the DC property of the depth pixel of the image sensor.

Figure 8:
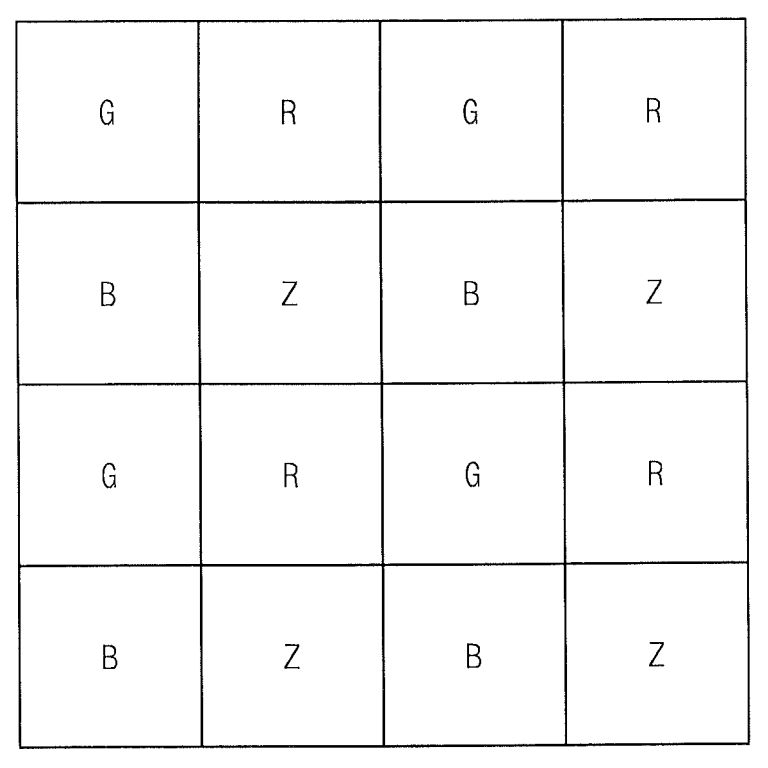
Figure 9:
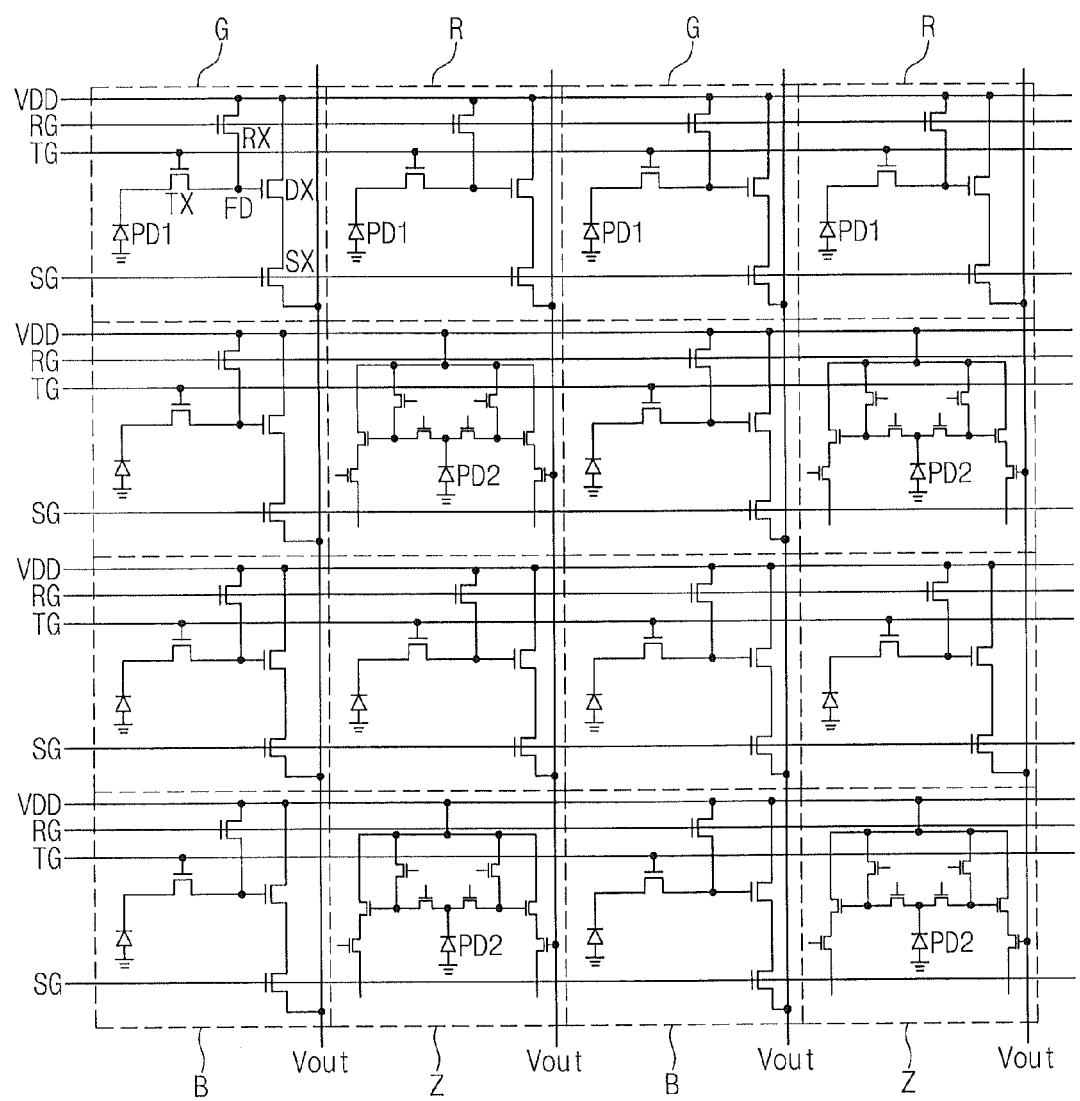
FIG. 9 is a circuit diagram illustrating an implementation of the sensor array of FIG. 8 according to example embodiments of the inventive concepts.
Figure 10:
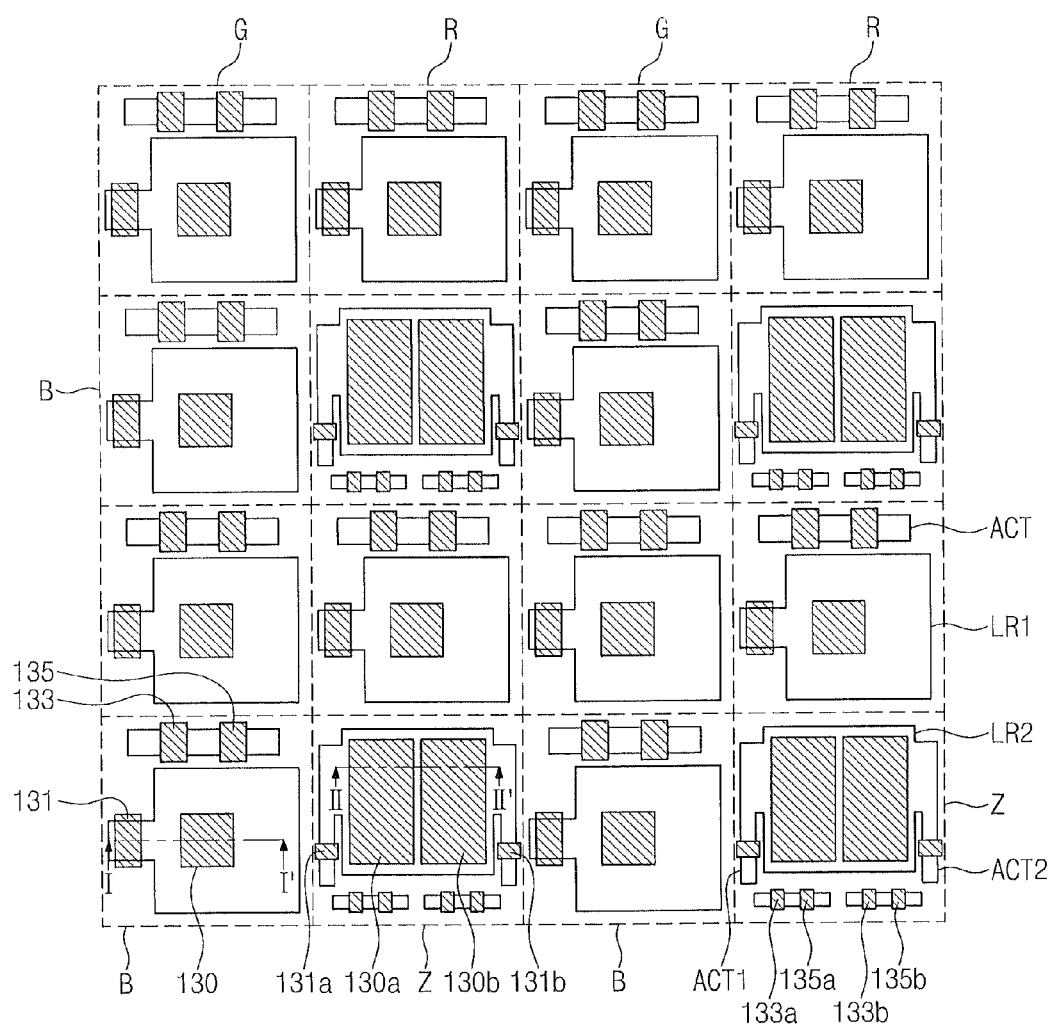
FIG. 10 is a plan view illustrating an implementation of the sensor array of FIG. 8 according to example embodiments of the inventive concepts.
Figure 11:
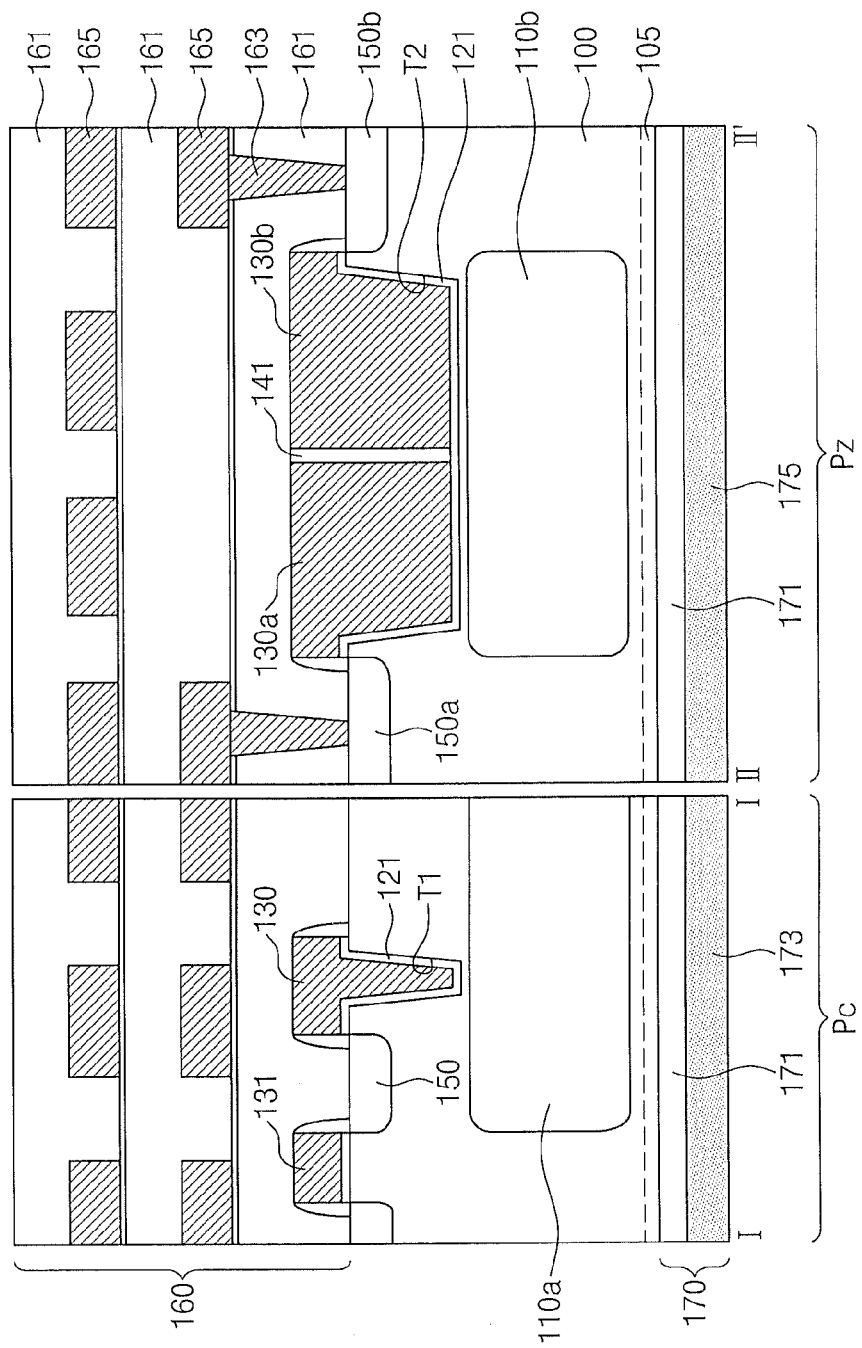
FIG. 11 is a sectional view taken along lines I-I' and II-II' of FIG. 10.
Figure 12:
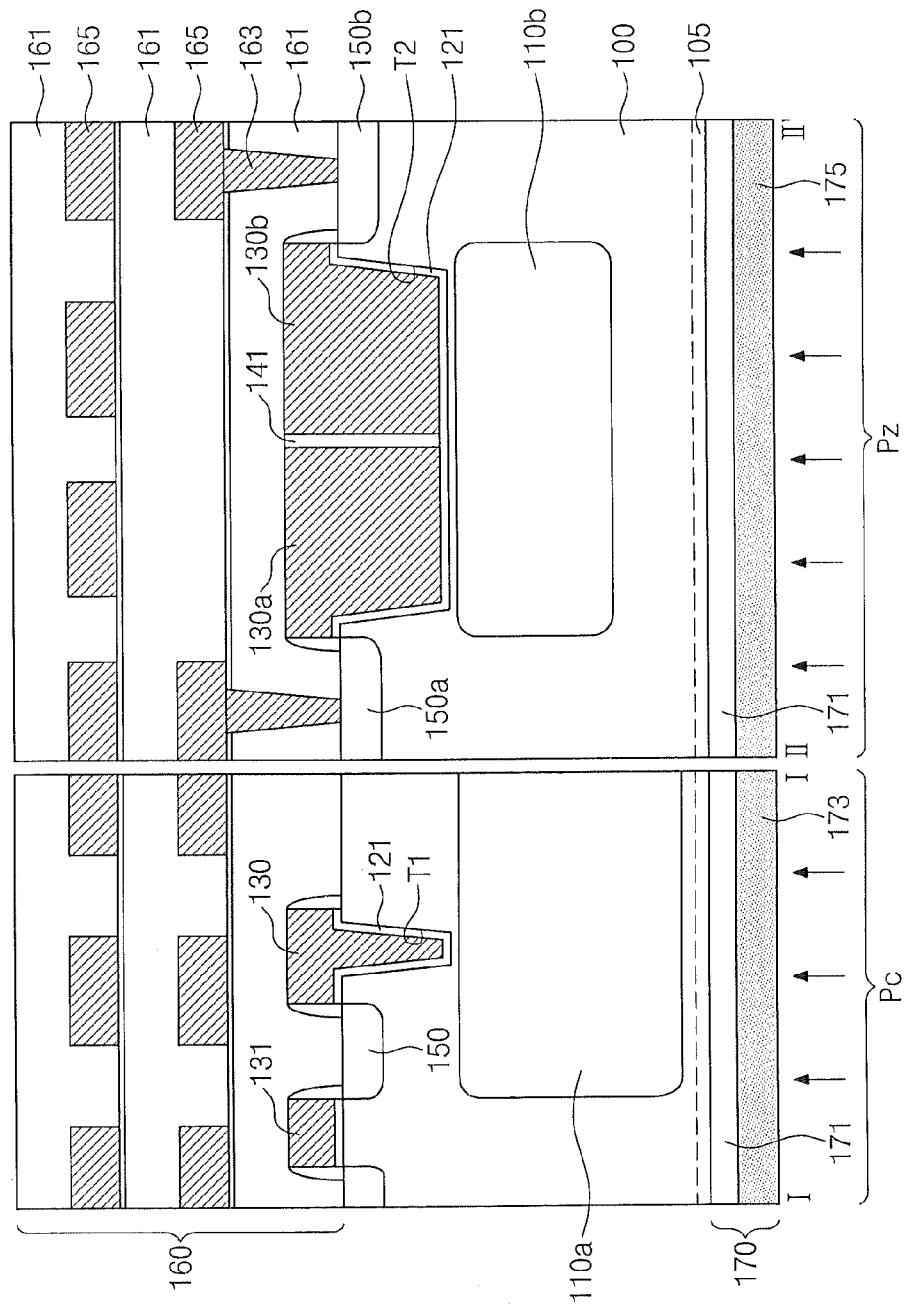
FIG. 12 is a sectional view taken along lines I-I' and II-II' of FIG. 10 that illustrates a modified version of an image sensor.

FIG. 8 is a schematic plan view illustrating a sensor array of an image sensor according to example embodiments of the inventive concepts. FIG. 9 is a circuit diagram illustrating a sensor array of an image sensor according to example embodiments of the inventive concepts. FIG. 10 is a plan view illustrating a sensor array of an image sensor according to example embodiments of the inventive concepts. FIG. 11 is a sectional view taken along lines I-I' and II-II' of FIG. 10. FIG. 12 is a sectional view taken along lines I-I' and II-II' of FIG. 10 that illustrates a modified version of an image sensor according to example embodiments of the inventive concepts.

Referring to FIG. 8, an image sensor may include a sensor array, in which a plurality of unit pixels R, G, B, and Z are provided that are arranged in a matrix. In example embodiments, the sensor array may include color pixels R, G, and B and depth pixels Z, and the color pixels may include red, green, and blue pixels R, G, and B. Each of the unit pixels R, G, B, and Z may be configured to sense light having a specific wavelength range. In the depicted embodiment, each of the depth pixels Z is disposed between two adjacent ones of the color pixels R, G, and B (e.g., between two B pixels in the horizontal direction and between two R pixels in the vertical direction). The unit pixels R, G, B, and Z may each have substantially the same area in this embodiment.

Referring to FIG. 9, each of the color pixels R, G, and B may include a first photoelectric conversion device and a color reading device, and each of the depth pixels may include a second photoelectric conversion device and first and second depth reading devices.

In detail, each of the color pixels R, G, and B may include a first photoelectric conversion device PD1, a transfer transistor TX, a reset transistor RX, a drive transistor DX, and a selection transistor SX.

The first photoelectric conversion device PD1 may be configured to receive visible light and generate electric charges, whose quantity is dependent on an intensity of the received visible light. The first photoelectric conversion device PD1 may be, for example, one of a photo diode, a photo transistor, a photo gate, a pinned photo diode (PPD), and any combination thereof.

The first photoelectric conversion device PD1 may be connected to the transfer transistor TX, and the transfer transistor TX may be configured to control transmission of charges from the first photoelectric conversion device PD1 to a charge-detection node FD. The transfer transistor TX may be controlled by a charge transfer signal TG.

The charge-detection node FD may store charges transferred from the first photoelectric conversion device PD1. The charge-detection node FD may be electrically connected to the drive transistor DX, and electric potential of the charge-detection node FD may be amplified by the drive transistor DX and be output in the form of an electrical signal. The charge-detection node FD may be connected to the reset transistor RX and the potential of the charge-detection node FD may be periodically reset via the reset transistor RX. The reset transistor RX may be controlled by a reset signal RG. The source electrode of the reset transistor RX may be connected to the charge-detection node FD, and the drain electrode of the reset transistor RX may be connected to the power voltage VDD. When the reset transistor RX is turned on by the reset signal RG, the power voltage VDD may be transferred to the charge-detection node FD through the reset transistor RX and electric charges in the charge-detection node FD may be discharged via this operation.

The drive transistor DX may be configured to serve as a source follower buffer amplifier that amplifies and outputs an electric signal transferred from the charge-detection node FD.

The selection transistor SX may selectively connect an output line Vout to the color pixels R, G, and B, and this makes it possible to selectively output electrical signals from the color pixels R, G, and B. The selection transistor SX may be controlled by a selection signal SG. For example, when the selection transistor SX is turned on, an electric potential of the drain electrode of the drive transistor DX may be output to the output line Vout via the drain electrode of the selection transistor SX.

In certain embodiments, the driving signals TG, RG, and SG may be applied to the color pixels R, G, and B that are in the same row of the sensor array at substantially the same time. The color pixels R, G, and B that are in the same column of the sensor array may share a corresponding one of the output lines Vout.

In the present embodiment, each of the depth pixels Z may be the same as that of the depth pixel of FIG. 3 in terms of configuration and operation. That is, each of the depth pixels Z, as described with reference to FIG. 3, may include a second photoelectric conversion device PD2, the first and second transfer transistors TX1 and TX2 (e.g., of FIG. 3), the first and second reset transistors RX1 and RX2 (e.g., of FIG. 3), the first and second drive transistors DX1 and DX2 (e.g., of FIG. 3), and the first and second selection transistors SX1 and SX2 (e.g., of FIG. 3).

In the present embodiment, the driving signals TG1, TG2, RG1, RG2, SG1, and SG2 (e.g., of FIG. 3) may be applied to the depth pixels Z that are part of the same row of the sensor array at substantially the same time. The depth pixels Z that are in the same column of the sensor array may share a corresponding pair of the first and second output lines $V_{out1}$ and $V_{out2}$ (e.g., of FIG. 3).

Referring to FIGS. 10 and 11, the semiconductor substrate 100 may include color pixel regions $P_C$ and depth pixel regions $P_Z$. The color pixel regions $P_C$ may include red, green, and blue pixel regions. The semiconductor substrate 100 may have a first conductivity type and have opposed top and bottom surface. In example embodiments, the semiconductor substrate 100 may be a p-type epitaxial layer, and a highly-doped p-type layer 105 may be provided adjacent to the bottom surface of the semiconductor substrate 100.

In example embodiments, in the color pixel regions $P_C$, the semiconductor substrate 100 may include a first light-receiving region LR1 and a logic active region ACT that is defined by a device isolation layer (not shown). In the depth pixel regions $P_Z$, the semiconductor substrate 100 may include a second light-receiving region LR2 and first and second logic active regions ACT1 and ACT2 that are defined by the device isolation layer (not shown).

The first photoelectric conversion layer 110a may be formed in the first light-receiving region LR1. The first photoelectric conversion layer 110a may comprise an n-type doped layer that is formed in the semiconductor substrate 100 to constitute a photodiode along with the p-type epitaxial layer. The first photoelectric conversion layer 110a may be configured to generate and store charges from visible light incident therein.

The second photoelectric conversion layer 110b may be formed in the second light-receiving region LR2. The second photoelectric conversion layer 110b may comprise an n-type doped layer that is formed in the semiconductor substrate 100 to constitute a photodiode along with the p-type epitaxial layer. The second photoelectric conversion layer 110b may be configured to generate and store charges from infrared light incident therein. In example embodiments, an n-type impurity concentration of the second photoelectric conversion layer 110b may be substantially the same as that of the first photoelectric conversion layer 110a. Alternatively, the first and second photoelectric conversion layers 110a and 110b may be formed to have n-type impurity concentrations that are different from each other.

In example embodiments, the first and second photoelectric conversion layers 110a and 110b may be formed to have substantially the same vertical depth, as shown in FIG. 11. Here, the vertical depths of the first and second photoelectric conversion layers 110a and 110b may be distances from the top surface of the semiconductor substrate 100 to the bottom surfaces of the first and second photoelectric conversion layers 110a and 110b. In other embodiments, as shown in FIG. 12, the first and second photoelectric conversion layers 110a and 110b may be formed to have different vertical depths from each other. A penetrating depth of the visible light is shorter than that of the infrared light. In this sense, in the case where light is incident through the bottom surface of the semiconductor substrate 100, the first photoelectric conversion layer 110a may be formed to have a depth that is larger than a depth of the second photoelectric conversion layer 110b.

A first trench T1 may be formed in the color pixel region $P_C$ of the semiconductor substrate 100, and a second trench T2 may be formed in the depth pixel region $P_Z$ of the semiconductor substrate 100. The first and second trenches T1 and T2 may be formed near or through the top surface of the semiconductor substrate 100. In example embodiments, the first trench T1 may have a width that is smaller than a width of the second trench T2, and the first trench T1 may be formed in a central region of the first photoelectric conversion layer 110a. The second trench T2 may be above the second photoelectric conversion layer 110b. Bottom surfaces of the first and second trenches T1 and T2 may be positioned at substantially the same vertical depth into the semiconductor substrate 100. In certain embodiments, the vertical depths of the first and second trenches T1 and T2 may be changed depending on properties of the unit pixels (e.g., to be different from each other).

In example embodiments, a transfer gate electrode 130 may be provided in the first trench T1 with a gate insulating layer 121 interposed therebetween, and the first and second transfer gate electrodes 130a and 130b may be provided in the second trench T2 with a gate insulating layer 121 interposed therebetween. A width of each of the first and second transfer gate electrodes 130a and 130b may be smaller than half the width of the second trench T2. Further, an inter-gate insulating layer 141 may be interposed between the first and second transfer gate electrodes 130a and 130b.

When viewed in plan view, the transfer gate electrode 130 that is disposed in the color pixel region $P_C$ may cover only a portion of the first photoelectric conversion layer 110a. In contrast, the first and second transfer gate electrodes 130a and 130b that are disposed in the depth pixel region $P_Z$ may cover all or substantially all of the second photoelectric conversion layer 110b. In some embodiments, the top surfaces of the first and second transfer gate electrodes 130a and 130b may be substantially coplanar with the top surface of the transfer gate electrode 130.

A charge-detection layer 150 may be formed in the semiconductor substrate 100 at a side of the transfer gate electrode 130 in the color pixel region $P_C$. In the depth pixel region $P_Z$, the first charge-detection layer 150a may be formed in the semiconductor substrate 100 at a side of the first transfer gate electrode 130a and the second charge-detection layer 150b may be formed in the semiconductor substrate 100 at a side of the second transfer gate electrode 130b. In the depth pixel region $P_Z$, the second photoelectric conversion layer 110b may be interposed between the first and second charge-detection layers 150a and 150b.

The charge-detection layer 150 and the first and second charge-detection layers 150a and 150b may be formed by doping the semiconductor substrate 100 with n-type impurities. In example embodiments, the first and second charge-detection layers 150a and 150b may have an n-type impurity concentration that is higher than that of the second photoelectric conversion layer 110b. The bottom surfaces of the first and second charge-detection layers 150a and 150b may be positioned at a smaller vertical depth into the semiconductor substrate 100 than the vertical depths of the first and second transfer gate electrodes 130a and 130b.

In the color pixel region $P_C$, a reset gate electrode 131 may be disposed adjacent to the charge-detection layer 150. In the depth pixel region $P_Z$, a first reset gate electrode 131a may be disposed adjacent to the first charge-detection layer 150a and a second reset gate electrode 131b may be disposed adjacent to the second charge-detection layer 150b.

The drive and selection transistors may be disposed in the logic active region ACT of the color pixels R, G, and B. For example, a drive gate electrode 133 and a selection gate electrode 135 may be disposed to cross the logic active region ACT, and source/drain impurity regions may be formed in portions of the logic active region ACT positioned at both sides of each of the drive and selection gate electrodes 133 and 135. A first drive transistor and a first selection transistor may be provided in the first logic active region ACT1 of the depth pixel Z. For example, the first drive gate electrode 133a and the first selection gate electrode 135a may be disposed on the first logic active region ACT1, and source/drain impurity regions may be formed in portions of the first logic active region ACT1 positioned at both sides of each of the first drive gate electrode 133a and the first selection gate electrode 135a. Further, a second drive transistor and a second selection transistor may be provided in the second logic active region ACT2 of the depth pixel Z. For example, the second drive gate electrode 133b and the second selection gate electrode 135b may be disposed on the second logic active region ACT2, and source/drain impurity regions may be formed in portions of the second logic active region ACT2 positioned at both sides of each of the second drive gate electrode 133b and the second selection gate electrode 135b.

In example embodiments, an interconnection structure 160 may be provided on the top surface of the semiconductor substrate 100 with the color pixels R, G, and B and the depth pixels Z, and the optically-transparent layer 170 may be provided on the bottom surface of the semiconductor substrate 100.

In example embodiments, the interconnection structure 160 may include metal wires 165 that are vertically stacked on the top surface of the semiconductor substrate 100, contact plugs 163 that vertically connect the metal wires 165, and interlayer insulating layers 161. The interlayer insulating layers 161 and the metal wires 165 may be repeatedly stacked on the top surface of the semiconductor substrate 100. In example embodiments, the arrangement of the metal wires 165 may have no or weak dependence on the first and second photoelectric conversion layers 110a and 110b. For example, the metal wires 165 may be disposed to cross the first and second photoelectric conversion layers 110a and 110b.

In example embodiments, the optically-transparent layer 170 may include a planarization layer 171, a first optical filter layer 173, and a second optical filter layer 175.

The planarization layer 171 may be in direct contact with the bottom surface of the semiconductor substrate 100. The planarization layer 171 may be formed of a material, whose refractive index is higher than that of silicon oxide, and this may make it possible to improve light sensitivity of the image sensor. For example, the planarization layer 171 may be formed of a material having a refractive index ranging from about 1.4 to about 4.0.

The first optical filter layer 173 may be formed in the color pixel region $P_C$ and allow visible light to pass into the color pixels. The first optical filter layer 173 may include color filters configured to realize red, green, and blue colors. Alternatively, the first optical filter layer 173 may include color filters configured to realize other colors (e.g., cyan, magenta, or yellow). The second optical filter layer 175 may be formed on the depth pixel region $P_Z$ and allow infrared light to pass into the depth pixels. The second optical filter layer 175 may be configured to allow external infrared light to pass toward the depth pixel. In other words, the optical filter layer 175 may be configured to prevent visible light and ultraviolet light from passing into the depth pixel.

Furthermore, although not shown, micro lenses may be formed on the first and second optical filter layers 173 and 175.

Figure 13:
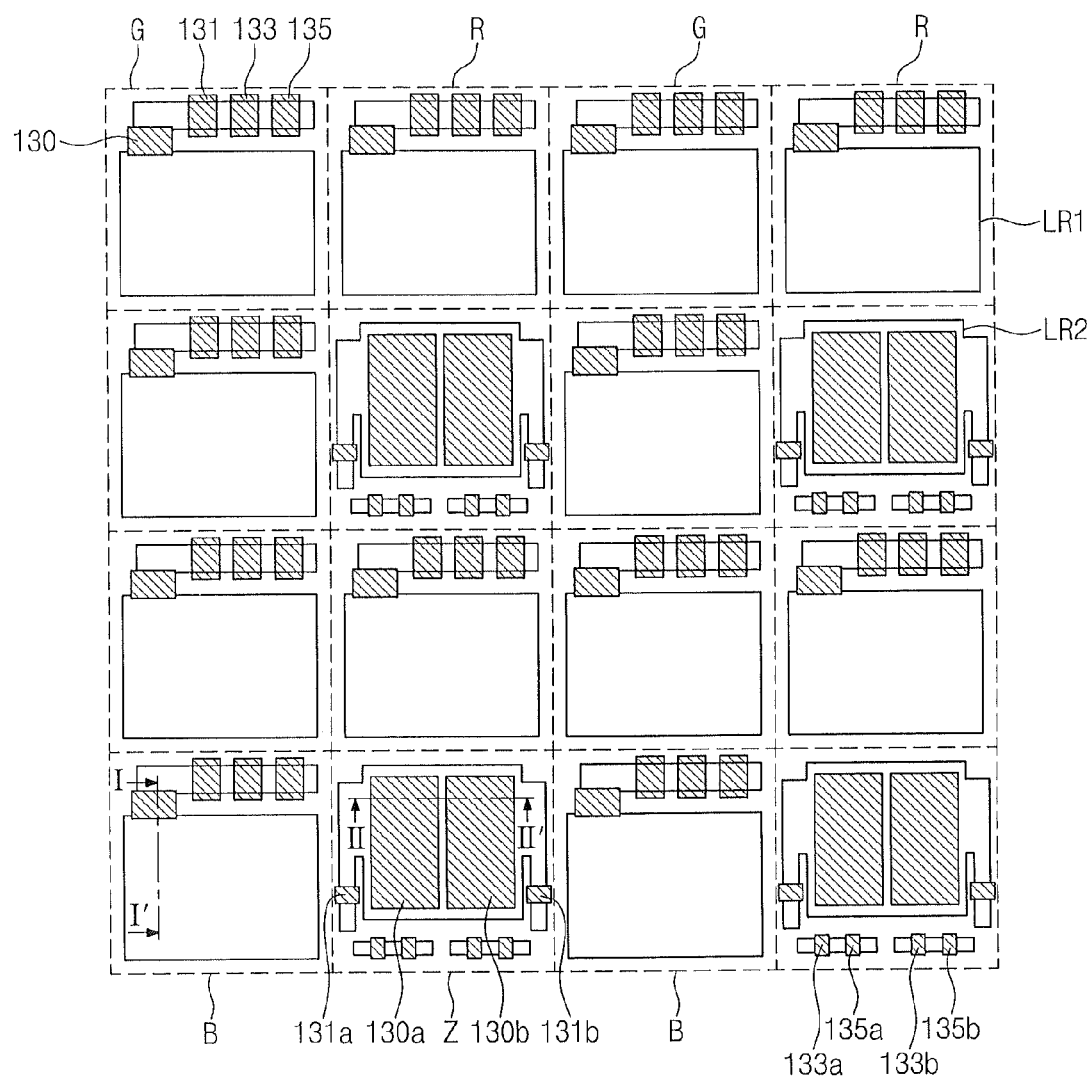
FIG. 13 is a plan view illustrating a sensor array of an image sensor according to further example embodiments of the inventive concepts.
Figure 14:
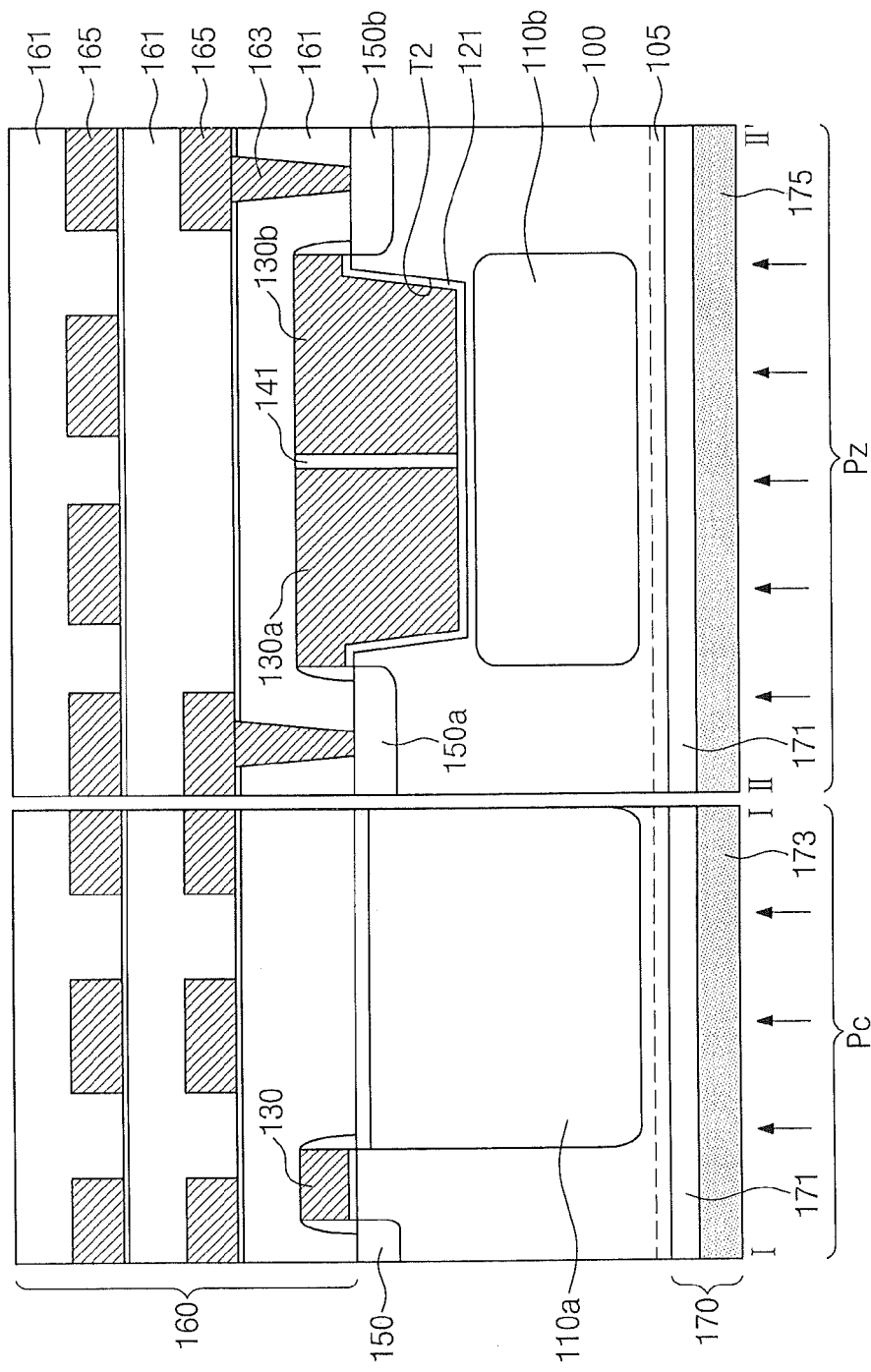
FIG. 14 is a sectional view taken along lines I-I' and II-II' of FIG. 13.

FIG. 13 is a plan view illustrating a sensor array of an image sensor according to further example embodiments of the inventive concepts. FIG. 14 is a sectional view taken along lines I-I' and II-II' of FIG. 13.

Referring to FIGS. 13 and 14, as described above with reference to FIGS. 8 through 11, the sensor array may include color pixels R, G, and B and depth pixels Z. In the following description of FIGS. 13 and 14, previously described elements may be identified by a similar or identical reference number without repeating the description thereof for the sake of brevity.

In the embodiment of FIGS. 13 and 14, the transfer gate electrode 130 of the color pixel region $P_C$ may be disposed at a side of the first photoelectric conversion layer 110a. The bottom surface of the transfer gate electrode 130 may be positioned on the top surface of the semiconductor substrate 100. In other words, the bottom surface of the transfer gate electrode 130 may be positioned at a level higher than the bottom surfaces of the first and second transfer gate electrodes 130a and 130b that are disposed in the depth pixel region $P_Z$.

Figure 15:
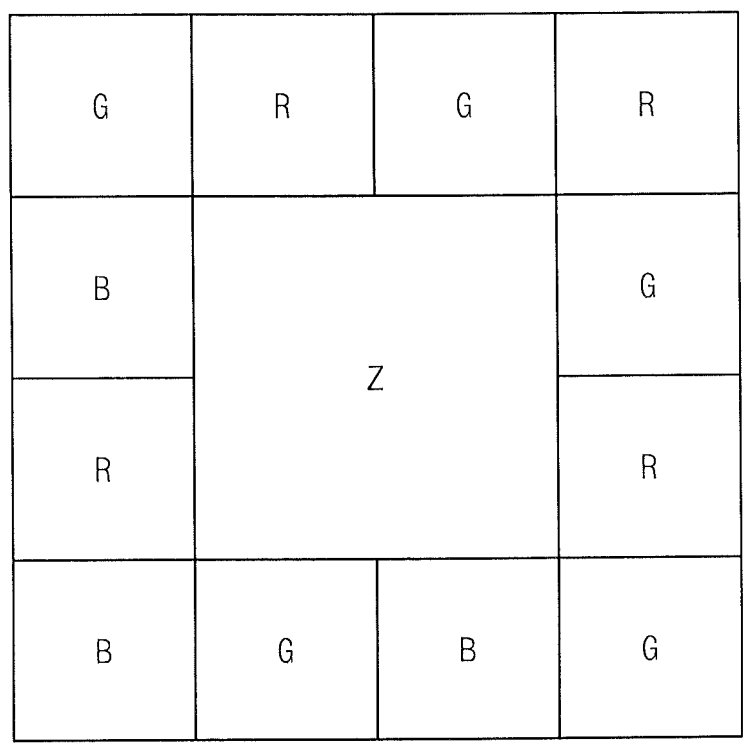
FIG. 15 is a schematic plan view illustrating a sensor array of an image sensor according to still other example embodiments of the inventive concepts.
Figure 16:
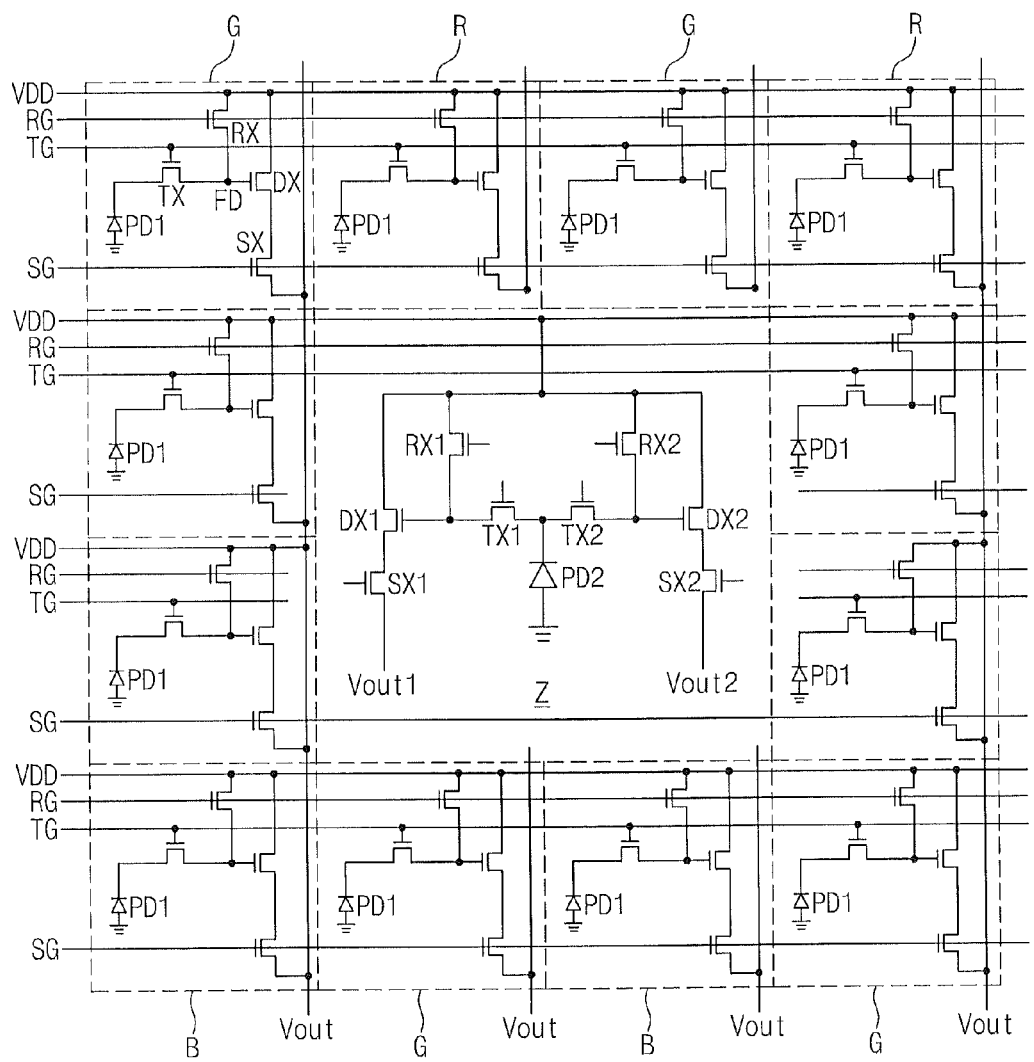
FIG. 16 is a circuit diagram illustrating an implementation of the sensor array of FIG. 15 according to example embodiments of the inventive concepts.
Figure 17:
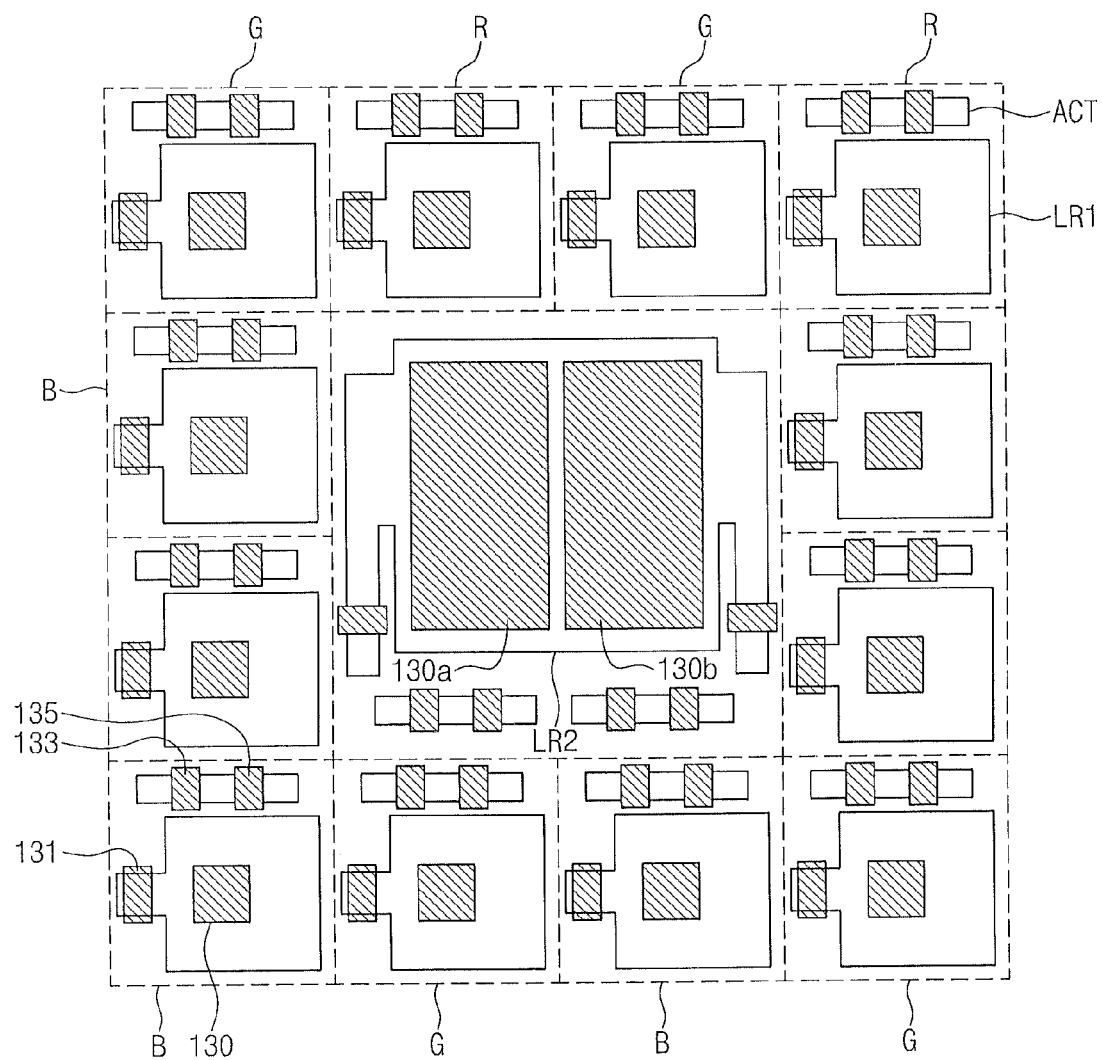
FIG. 17 is a plan view illustrating an implementation of the sensor array of FIG. 15 according to example embodiments of the inventive concepts.

FIG. 15 is a schematic plan view illustrating a sensor array of an image sensor according to still further example embodiments of the inventive concepts. FIG. 16 is a circuit diagram of an implementation of the sensor array of the image sensor of FIG. 15. FIG. 17 is a plan view of an implementation of the sensor array of the image sensor of FIG. 15.

Referring to FIGS. 15, 16, and 17, the sensor array may include color pixels R, G, and B and depth pixels Z. The color pixels R, G, and B may include red pixels R, green pixels G, and blue pixels B. Each of the unit pixels R, G, B, and Z may be configured to sense light having a specific wavelength range. In the present embodiment, the depth pixel may have an area larger than that of each color pixel, and the color pixels may be arranged around the depth pixel.

As described with reference to FIGS. 8 through 11, each of the color pixels R, G, and B may include the first photoelectric conversion device PD1, the transfer transistor TX, the reset transistor RX, the drive transistor DX, and the selection transistor SX. The structure and operation of the color pixels R, G, and B may be the same as is described above with reference to FIGS. 8 through 11.

As described with reference to FIG. 3, the depth pixel Z may include the second photoelectric conversion device PD2, the first and second transfer transistors TX1 and TX2, the first and second reset transistors RX1 and RX2, the first and second drive transistors DX1 and DX2, and the first and second selection transistors SX1 and SX2. In the depth pixel Z, the first and second transfer gate electrodes 130a and 130b may be between the first and second charge-detection layers 150a and 150b and may have bottom surfaces that are positioned below the bottom surfaces of the first and second charge-detection layers 150a and 150b. This makes it possible to suppress electric interference caused by the first and second transfer gate electrodes 130a and 130b when electric charges are detected from the first and second charge-detection layers 150a and 150b.

Figure 18:
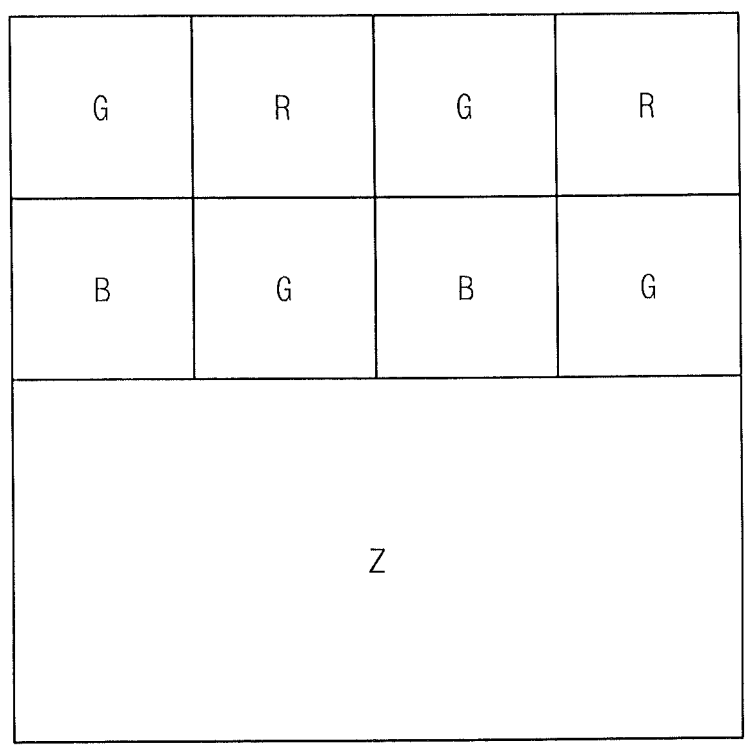
FIG. 18 is a schematic plan view illustrating a sensor array of an image sensor according to still further example embodiments of the inventive concepts.
Figure 19:
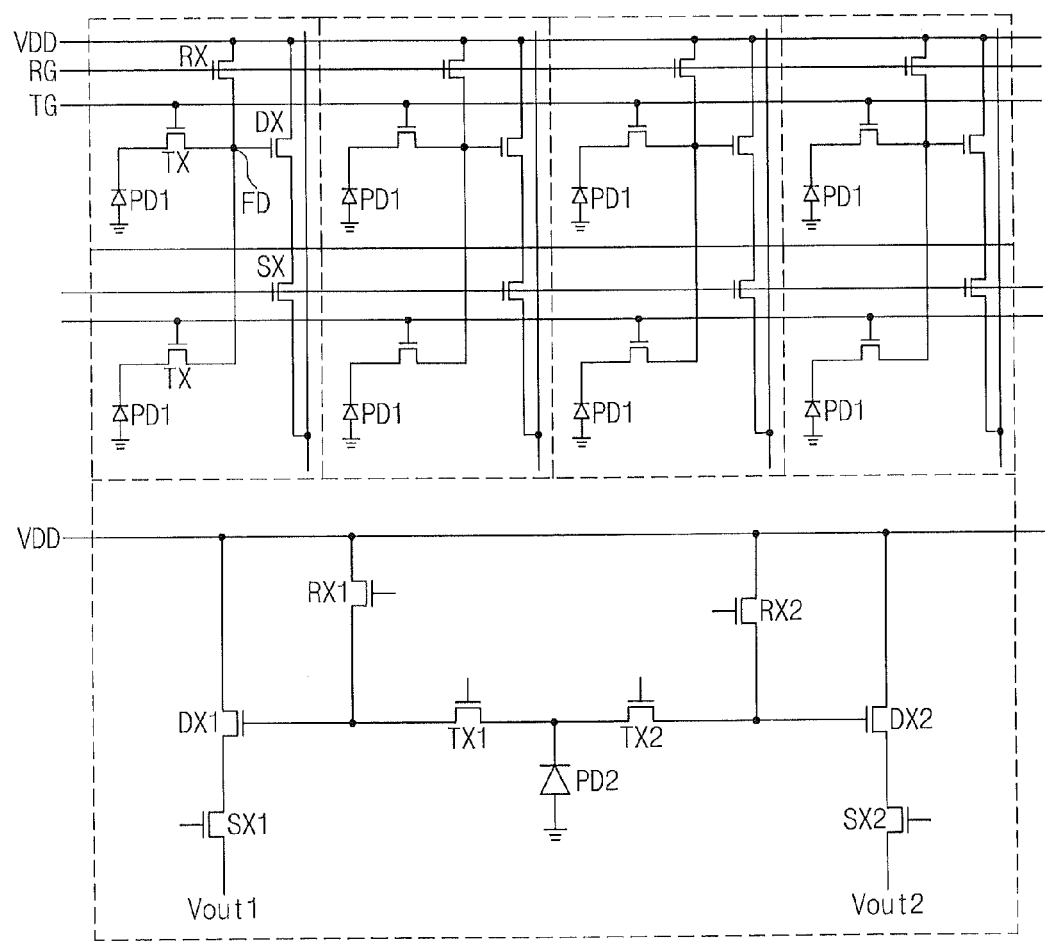
FIG. 19 is a circuit diagram illustrating an implementation of the sensor array of FIG. 18 according to example embodiments of the inventive concepts.
Figure 20:
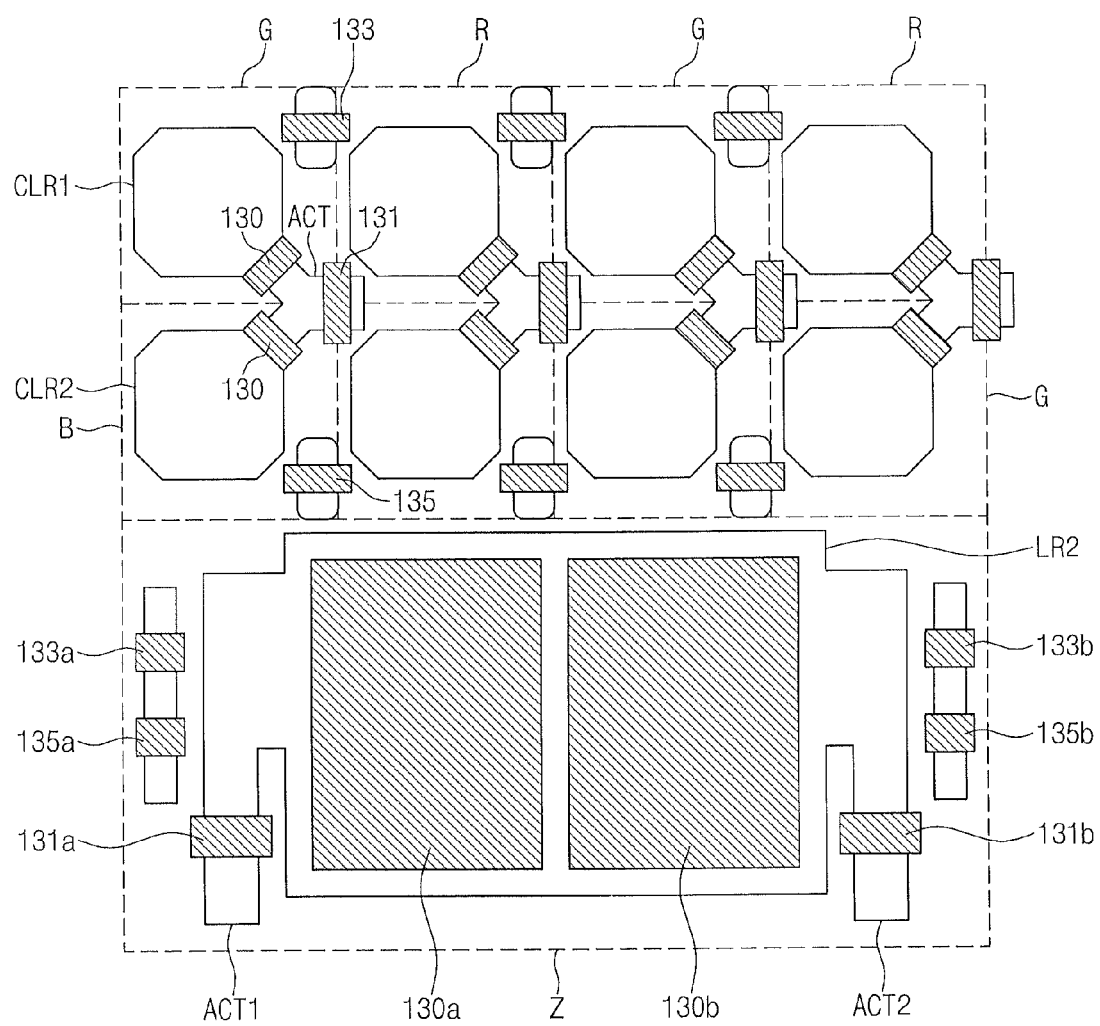
FIG. 20 is a plan view illustrating an implementation of the sensor array of FIG. 18 according to example embodiments of the inventive concepts.

FIG. 18 is a schematic plan view illustrating a sensor array of an image sensor according to even other example embodiments of the inventive concepts. FIG. 19 is a circuit diagram of an implementation of the sensor array of FIG. 18. FIG. 20 is a plan view of an implementation of the sensor array of FIG. 18.

Referring to FIGS. 18, 19, and 20, the sensor array may include color pixels R, G, and B and a depth pixel Z. The color pixels R, G, and B may include red pixels R, green pixels G, and blue pixels B. Each of the unit pixels R, G, B, and Z may be configured to sense light having a specific wavelength range. In the present embodiment, the depth pixel Z may have an area larger than that of each of the color pixels R, G, and B. The color pixels R, G, and B may be provided to have a matrix-shaped arrangement, and the depth pixel Z may be provided parallel to a row direction and be in contact with a specific row of the color pixels R, G, and B.

Further, in the present embodiment, each of the color pixels R, G, and B may include the first photoelectric conversion device PD1 and the transfer transistor TX, and the reset transistors RX, the driver transistor DX, and the selection transistor SX may be shared by a pair of the first photoelectric conversion devices PD1 that are adjacent to each other. In addition, a pair of the transfer transistors TX that are adjacent to each other may be connected in common to a charge-detection node FD.

In the color pixels R, G, and B, the semiconductor substrate 100 may include a first color light-receiving region CLR1, a second color light-receiving region CLR2, and the logic active region ACT connected in common to the first and second color light-receiving regions CLR1 and CLR2. As described with reference to FIG. 11, the first photoelectric conversion layer 110a may be formed in each of the first and second color light-receiving regions CLR1 and CLR2. Each of the color pixels R, G, and B may include the transfer gate electrode 130 (e.g., of FIG. 11) that is provided between the first and second color light-receiving regions CLR1 and CLR2 and the logic active region ACT. The charge-detection layer 150 (e.g., of FIG. 11) may be provided in the logic active region ACT, and the charge-detection layer 150 may share a pair of the first photoelectric conversion layers 110a that are adjacent to each other.

FIGS. 21 through 27 are sectional views illustrating a method of fabricating an image sensor according to example embodiments of the inventive concepts.

Figure 21:
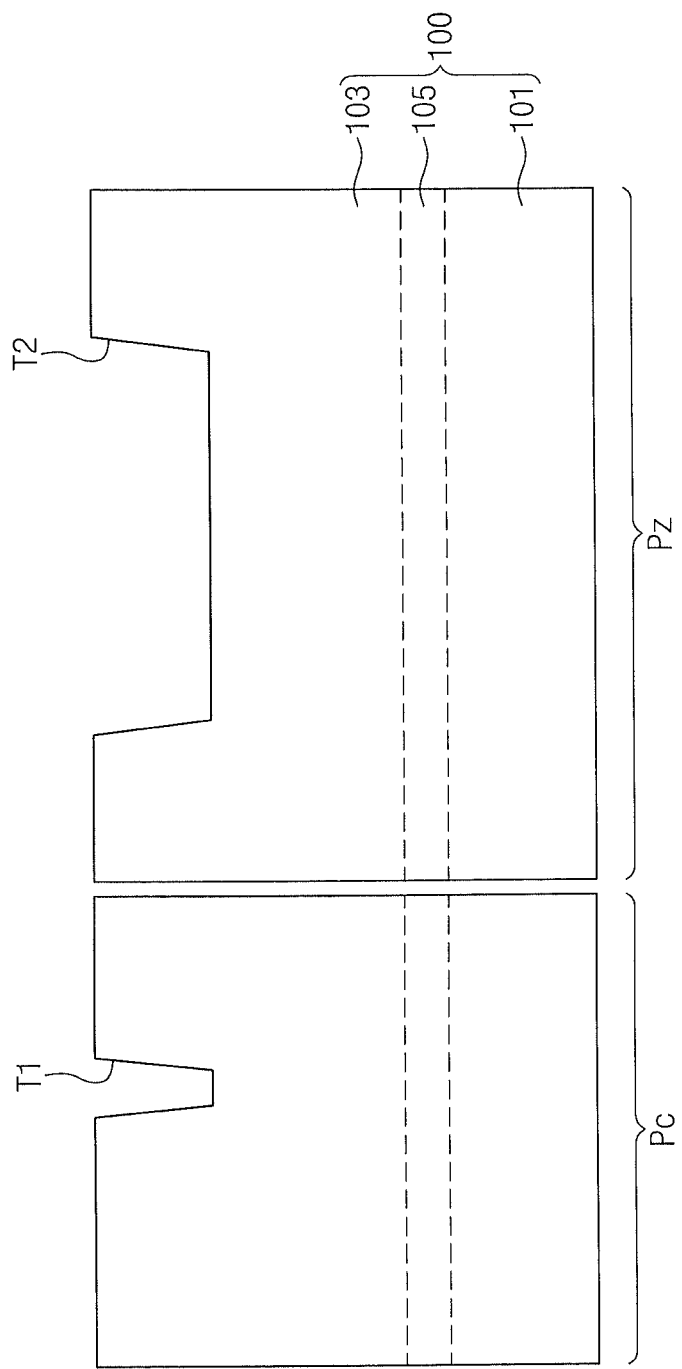
FIGS. 21 through 27 are sectional views illustrating a method of fabricating an image sensor according to example embodiments of the inventive concepts.

Referring to FIG. 21, the semiconductor substrate 100 may include the color pixel region $P_C$ and the depth pixel region $P_Z$. The semiconductor substrate 100 may have a first conductivity type and may have opposed tops and bottom surfaces.

In example embodiments, the semiconductor substrate 100 may comprise a p-type bulk substrate 101 that has a p-type epitaxial layer 103 provided thereon. In the semiconductor substrate 100, a p-type deep well 105 may be formed by highly doping the p-type epitaxial layer 103 with p-type impurities. The p-type deep well 105 may be, for example, between the p-type epitaxial layer 103 and the bulk substrate 101. The p-type deep well 105 may have an impurity concentration that is higher than the impurity concentrations of the p-type bulk substrate 101 and the p-type epitaxial layer 103. In example embodiments, the surface of the p-type epitaxial layer 103 that is opposite the p-type deep well layer may be defined as the top surface of the semiconductor substrate 100, and the surface of the p-type bulk substrate 101 that is opposite the p-type deep well layer may be defined as the bottom surface of the semiconductor substrate 100.

As described above, the semiconductor substrate 100 may include the p-type bulk substrate 101 and the p-type epitaxial layer 103 grown on the p-type bulk substrate 101, but example embodiments of the inventive concepts are not be limited thereto. For example, an n-type bulk substrate may be used in place of the p-type bulk substrate 101. Further, in the semiconductor substrate 100, a p-type well formed in the bulk substrate 101 may be used in place of the p-type epitaxial layer 103. In other embodiments, the semiconductor substrate 100 may be a silicon-on-insulator (SOI) wafer. Further, the semiconductor substrate 100 may be provided in the form of a combination of the above-described examples.

The device isolation layer (not shown) may be formed in the semiconductor substrate 100 to define the light-receiving regions LR1 and LR2 (e.g., of FIG. 10) and the logic active regions ACT, ACT1, and ACT2 (e.g., of FIG. 3). The device isolation layer may be formed in the top surface of the semiconductor substrate 100 using, for example, a Shallow Trench Isolation (STI) or LOCal Oxidation of Silicon (LOCOS) process.

The trenches T1 and T2 may be formed in the semiconductor substrate 100, on the light-receiving regions LR1 and LR2. The first trench T1 may be formed in the color pixel region $P_C$, and the second trench T2 may be formed in the depth pixel region $P_Z$.

In example embodiments, the first and second trenches T1 and T2 may be simultaneously formed in the semiconductor substrate 100. In other embodiments, the first and second trenches T1 and T2 may be formed sequentially.

For example, the formation of the first and second trenches T1 and T2 may include forming a mask pattern (not shown) on the top surface of the semiconductor substrate 100, and anisotropically etching the semiconductor substrate 100 using the mask pattern as an etch mask. The mask pattern may include an opening exposing a portion of the color pixel region $P_C$ and another opening exposing a portion of the depth pixel region $P_Z$. The first and second trenches T1 and T2 may have slanted sidewalls. In example embodiments, the second trench T2 may have a width that is larger than a width of the first trench T1, and the first and second trenches T1 and T2 may have the same depth, when measured from the top surface of the semiconductor substrate 100. Further, the first and second trenches T1 and T2 may have bottom surfaces that are in the p-type epitaxial layer 103 and that are spaced apart from the p-type deep well 105. The depths of the first and second trenches T1 and T2 may be variously changed depending on operational conditions or required characteristics of the image sensor. For example, the depths of the first and second trenches T1 and T2 may be different from each other.

Figure 22:
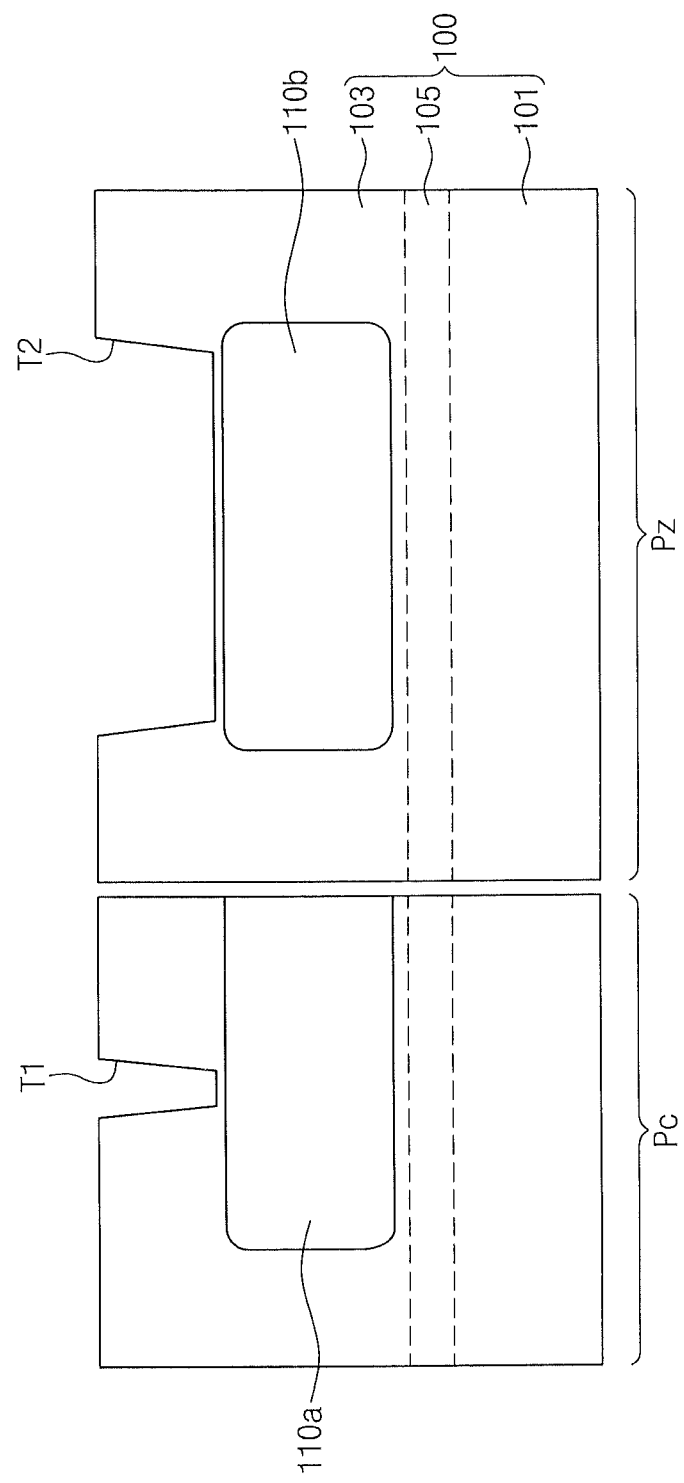

Referring to FIG. 22, the first photoelectric conversion layer 110a may be formed in the color pixel region $P_C$, and the second photoelectric conversion layer 110b may be formed in the depth pixel region $P_Z$.

In example embodiments, the formation of the first and second photoelectric conversion layers 110a and 110b may include forming a mask pattern on the top surface of the semiconductor substrate 100 to expose the first and second trenches T1 and T2, and then, injecting n-type impurities into the semiconductor substrate 100 using the mask pattern as an ion injection mask pattern to form n-type doped layers near the first and second trenches T1 and T2. Each n-type doped layer may constitute a photodiode, along with the p-type epitaxial layer. In addition, when viewed in plan view, the first trench T1 may overlap a portion of the first photoelectric conversion layer 110a, and the second trench T2 may overlap substantially all of the second photoelectric conversion layer 110b. The formation of the first and second photoelectric conversion layers 110a and 110b may further include forming a p-type doped layer in a region of the semiconductor substrate 100 adjacent to the first and second trenches T1 and T2.

In example embodiments, the n-type doped layers may be simultaneously formed on the color pixel region $P_C$ and the depth pixel region $P_Z$. Accordingly, an n-type impurity concentration of the first photoelectric conversion layer 110a may be substantially the same as that of the second photoelectric conversion layer 110b. Alternatively, the formation of the first photoelectric conversion layer 110a may be followed by the formation of the second photoelectric conversion layer 110b. In this case, the n-type impurity concentration of the first photoelectric conversion layer 110a may be different from that of the second photoelectric conversion layer 110b.

As described above, the first and second photoelectric conversion layers 110a and 110b may be formed after the formation of the first and second trenches T1 and T2, but example embodiments of the inventive concepts may not be limited thereto. For example, the first and second trenches T1 and T2 may be formed after the formation of the first and second photoelectric conversion layers 110a and 110b.

Figure 23:
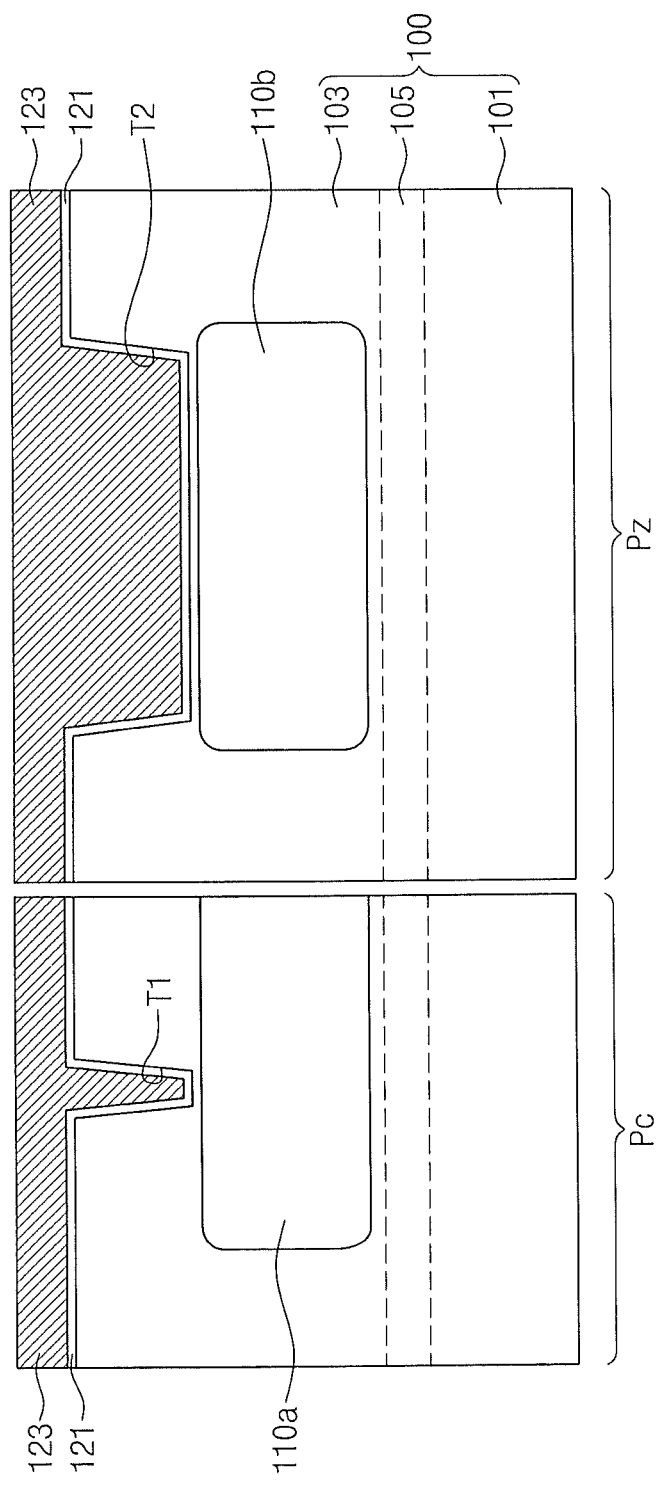

Referring to FIG. 23, a gate insulating layer 121 and a gate conductive layer 123 may be sequentially formed on the top surface of the semiconductor substrate 100 and in the first and second trenches T1 and T2. The gate insulating layer 121 may be formed conformally on inner surfaces of the first and second trenches T1 and T2, and the gate conductive layer 123 may be formed to fill the remainder of the first and second trenches T1 and T2.

In example embodiments, the gate insulating layer 121 may be an oxide layer, which may be formed by a thermal oxidation process. For example, the gate insulating layer 121 may be formed by a dry oxidation process using $O_2$ or a wet oxidation process using $H_2O$. In other embodiments, the gate insulating layer 121 may be formed of or include at least one of $SiO_2$, SiON, SiN, $Al_2O_3$, $Si_3N_4$, GexOyNz, GexSiyOz, or high-k materials. Here, the high-k materials may include $HfO_2$, $ZrO_2$, $Al_2O_3$, $Ta_2O_5$, hafnium silicate, zirconium silicate, or any combination thereof and be formed using an atomic layer deposition process. Further, the gate insulating layer 121 may be formed by stacking at least two materials selected from the group consisting of the enumerated materials.

In example embodiments, the gate conductive layer 123 may be formed of or include at least one of doped polysilicon or metals (e.g., tungsten (W), titanium (Ti), or titanium nitride (TiN)). The gate conductive layer 123 may be formed by a layer-forming technique with a good step coverage property (for example, chemical vapor deposition (CVD) or atomic layer deposition (ALD)).

Thereafter, a top surface of the gate conductive layer 123 may be planarized by, for example, an anisotropic etching process or a chemical mechanical polishing (CMP) process.

Figure 24:
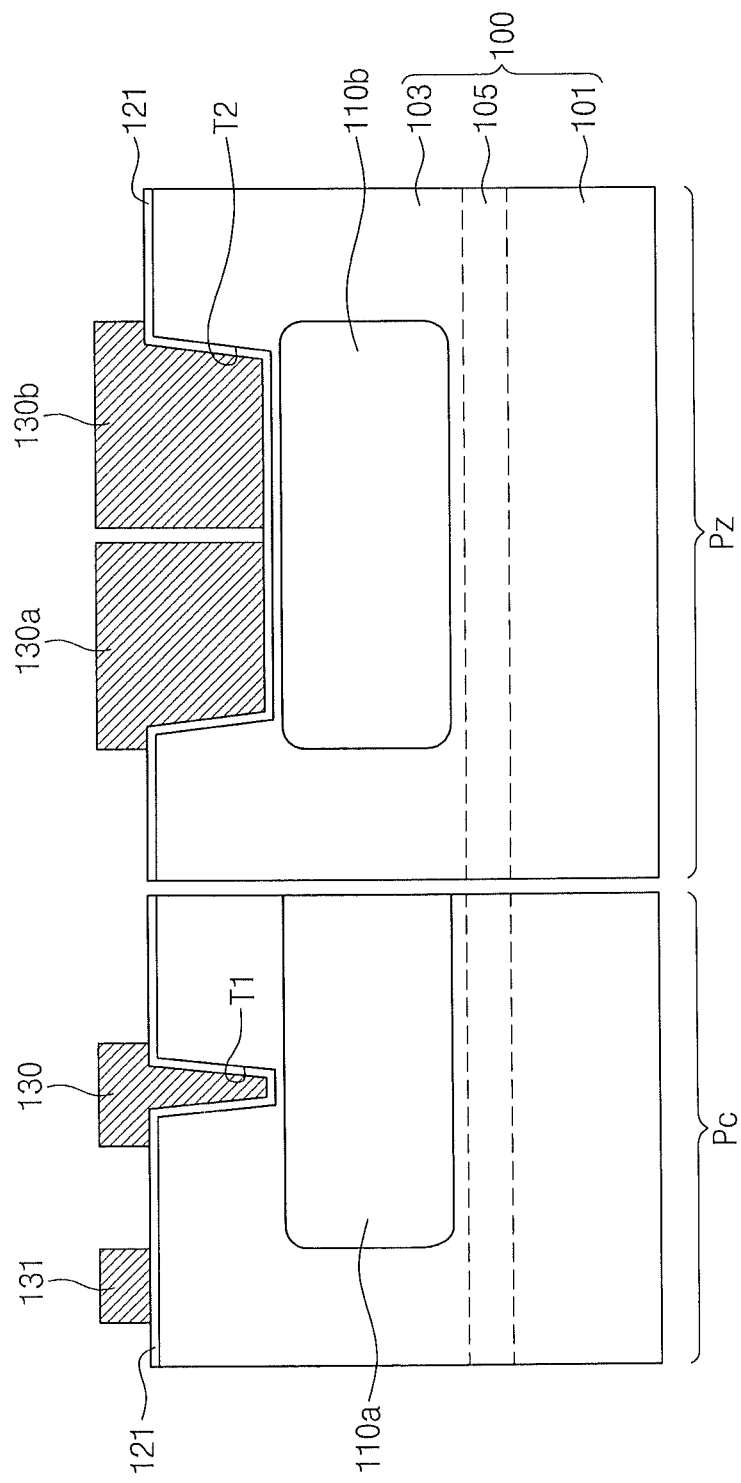

Referring to FIG. 24, the gate conductive layer 123 may be patterned to form the transfer gate electrode 130 in the color pixel region $P_C$ and the first and second transfer gate electrodes 130a and 130b in the depth pixel region $P_Z$.

The transfer gate electrode 130 may be formed in the first trench T1, and when viewed in plan view, may overlap a portion of the first photoelectric conversion layer 110a. The first and second transfer gate electrodes 130a and 130b may be formed in the second trench T2 and be spaced apart from each other in the second trench T2. Each of the first and second transfer gate electrodes 130a and 130b may have a width that is smaller than about ½ of a width of the second trench T2. At least a portion of a first sidewall of the first transfer gate electrode 130a may be slanted with respect to a plane that extends vertically through the semiconductor substrate 100, and at least a portion of a first sidewall of the second transfer gate electrode 130b may be slanted with respect to the plane that extends vertically through the semiconductor substrate 100.

In example embodiments, during the formation of the transfer gate electrode 130 in the color pixel region $P_C$, the reset gate electrode 131, the drive gate electrode 133, and the selection gate electrode 135, which were described with reference to FIG. 10, may be formed along with the transfer gate electrode 130. Further, during the formation of the first and second transfer gate electrodes 130a and 130b in the depth pixel region $P_Z$, the first and second reset gate electrodes 131a and 131b, the first and second drive gate electrodes 133a and 133b, and the first and second selection gate electrodes 135a and 135b may be formed along with the first and second transfer gate electrodes 130a and 130b.

Figure 25:
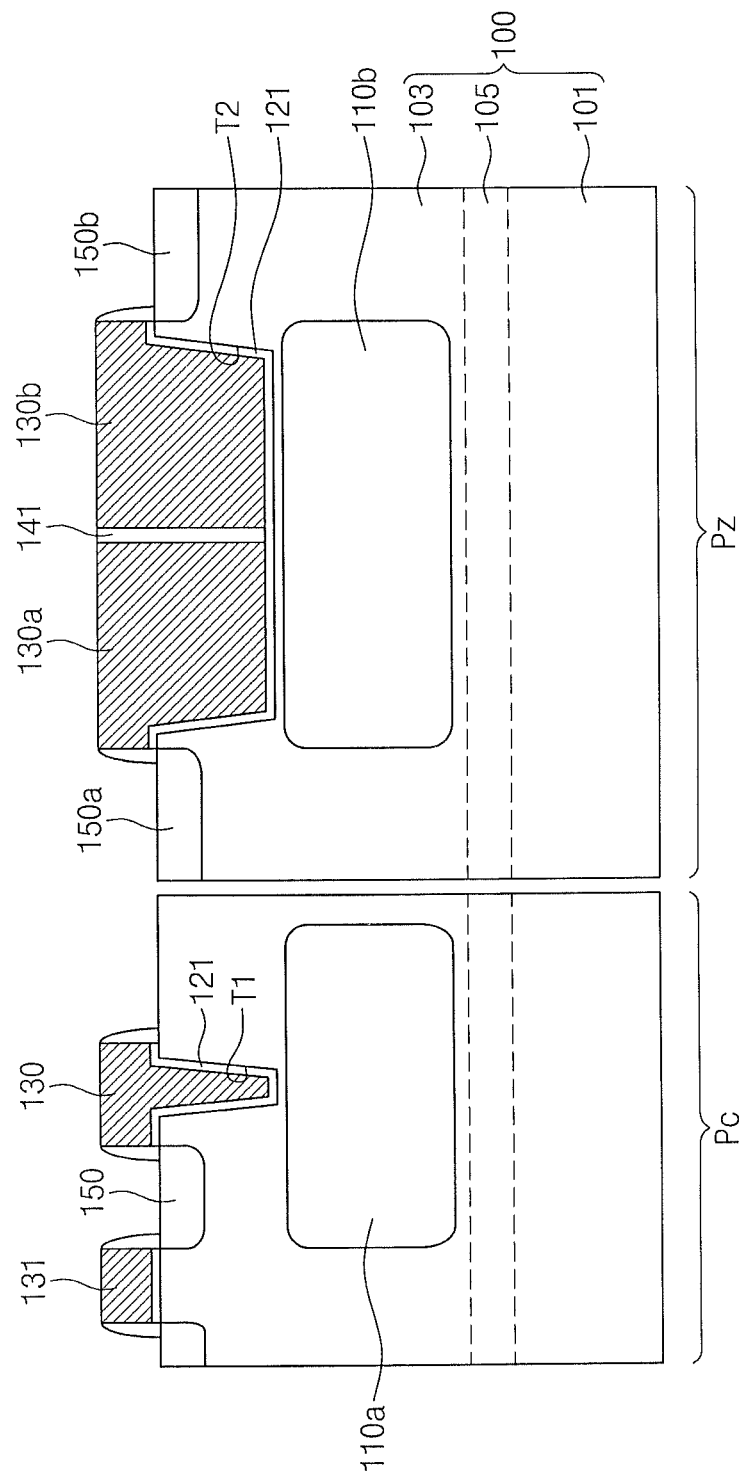

Referring to FIG. 25, the charge-detection layer 150 may be formed in the color pixel region $P_C$, and the first and second charge-detection layers 150a and 150b may be formed in the depth pixel region $P_Z$.

For example, the charge-detection layer 150 may be formed by injecting n-type impurities into the semiconductor substrate 100 between the reset gate electrode 131 and the transfer gate electrode 130. The first charge-detection layer 150a may be formed by injecting n-type impurities into the semiconductor substrate 100 along a side of the first transfer gate electrode 130a, and the second charge-detection layer 150b may be formed by injecting n-type impurities into the semiconductor substrate 100 along a side of the second transfer gate electrode 130b such that the first and second transfer gate electrodes 130a, 130b are between the first and second charge-detection layers 150a, 150b.

In example embodiments, the first and second charge-detection layers 150a and 150b may be formed to have an ion injection depth (or projection range) that is smaller than that of the second photoelectric conversion layer 110b. For example, the first and second charge-detection layers 150a and 150b may be formed in such a way that bottom surfaces thereof are positioned over those of the first and second transfer gate electrodes 130a and 130b. In addition, the first and second charge-detection layers 150a and 150b may be formed to have an n-type impurity concentration that is higher than that of the second photoelectric conversion layer 110b.

Figure 26:
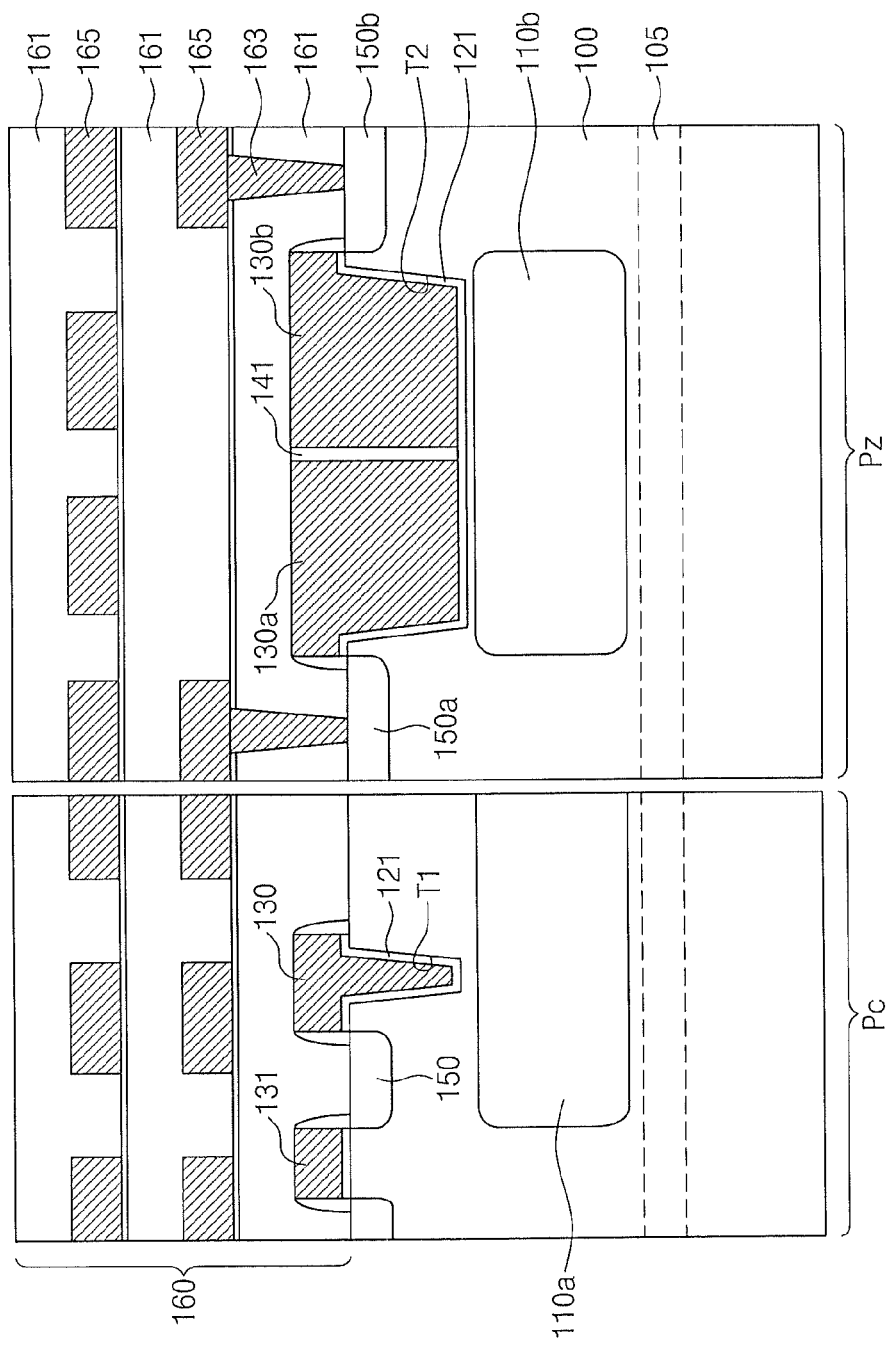

Referring to FIG. 26, the interconnection structure 160 may be formed on the top surface of the semiconductor substrate 100 provided with the color pixels and the depth pixels.

In example embodiments, the interconnection structure 160 may include the metal wires 165 vertically stacked on the top surface of the semiconductor substrate 100, the contact plugs 163 vertically connecting the metal wires 165, and the interlayer insulating layers 161.

For example, the interlayer insulating layer 161 may be formed to cover the top surface of the semiconductor substrate 100, and then, the metal wires 165 may be formed on the interlayer insulating layer 161 and be connected to the color and depth pixels. The interlayer insulating layers 161 and the metal wires 165 may be repeatedly stacked on the top surface of the semiconductor substrate 100. In example embodiments, the metal wires 165 may be arranged to have no or weak dependence on the first and second photoelectric conversion layers 110a and 110b. For example, the metal wires 165 may be disposed to cross the first and second photoelectric conversion layers 110a and 110b.

The interlayer insulating layer 161 may be formed of a material with a good gap-fill property and be planarized to have a flat top surface. In example embodiments, the interlayer insulating layer 161 may be formed of or include high density plasma (HDP) oxide, Tonen SilaZene (TOSZ), spin on glass (SOG), or undoped silica glass (USG).

The metal wires 165 may be formed by depositing a metal layer on the interlayer insulating layer 161 and patterning the metal layer. In example embodiments, the metal wires 165 may be formed of or include at least one selected from the group consisting of copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (TiN), and any alloys thereof.

Figure 27:
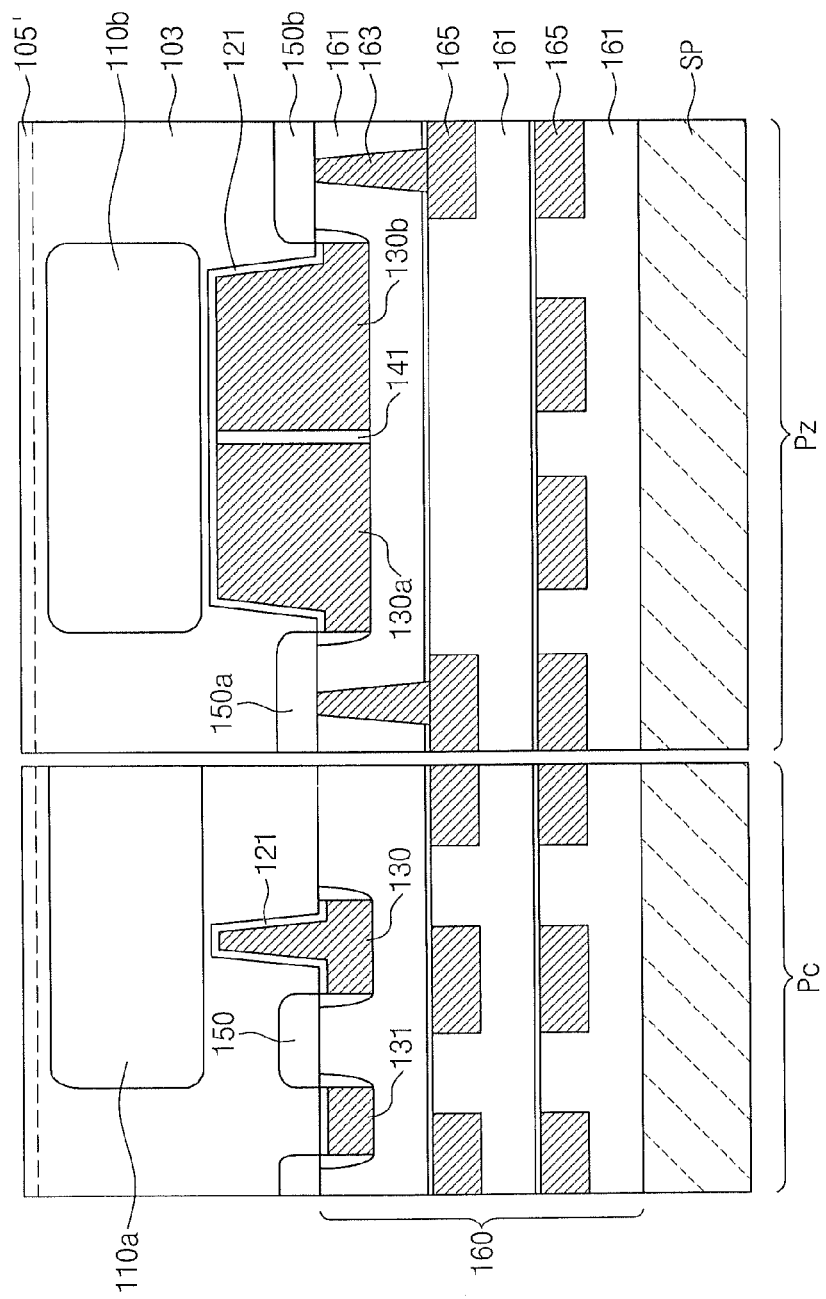

Referring to FIG. 27, a supporting substrate SP may be bonded to the interconnection structure 160.

For example, the supporting substrate SP may be bonded on the interlayer insulating layer 161, whose top surface is planarized or flat. The supporting substrate SP may support the semiconductor substrate 100 in a subsequent process of thinning the semiconductor substrate 100 and thereby prevent components in the semiconductor substrate 100 from being deformed in the subsequent process. As an example, a bulk substrate (e.g., a wafer) or a plastic substrate may be used as the supporting substrate SP.

Thereafter, a thinning process may be performed to the semiconductor substrate 100 with the first and second photoelectric conversion layers 110a and 110b. In the thinning process, the bulk substrate 101 may be ground or polished, and then, be anisotropically and/or isotropically etched. For example, the thinning process of the bulk substrate 101 may include inverting the semiconductor substrate 100, and then, mechanically removing a portion of the bulk substrate 101 with a grinder or chemical-mechanical polishing (CMP) system. The p-type bulk substrate 101 may be removed in the mechanical removing step of the thinning process. Thereafter, an anisotropic or isotropic etching step may be performed to the remaining portion of the semiconductor substrate 100 to control precisely a remaining thickness of the semiconductor substrate 100. In certain embodiments, the etching step of the semiconductor substrate 100 may be performed in a wet etching process using mixture of HF, $HNO_3$, and $CH_3COOH$. In the case where the p-type deep well 105 is formed in the p-type epitaxial layer 103, the p-type deep well 105 may be used as an etch stop layer for the thinning process.

As a result of the thinning process, the p-type bulk substrate 101 and the p-type deep well 105 may be removed in their entirety so that only the p-type epitaxial layer 103 remains of the semiconductor substrate 100. Alternatively, the thinning process may only partially remove the p-type deep well 105 so that a portion of the p-type deep well 105 remains in addition to the p-type epitaxial layer 103.

After the thinning process, the p-type epitaxial layer 103 may have a top surface, which is adjacent to the interconnection structure 160, and a bottom surface, which is opposite the top surface that was exposed by the thinning process. As a result of the process of thinning the semiconductor substrate 100, the incident light can be incident into the first and second photoelectric conversion layers 110a and 110b with a reduced propagation length, and this makes it possible to improve light sensitivity of the first and second photoelectric conversion layers 110a and 110b. Further, the thinning process may be performed in such a way that the remaining thickness of the semiconductor substrate 100 is in a range suitable for a wavelength of the incident light, in that the penetration depth of the incident light is dependent on a wavelength of the incident light.

After the thinning process of the semiconductor substrate 100, a curing process may be performed to remove surface defects from the exposed bottom surface of the semiconductor substrate 100 or the p-type epitaxial layer 103. The curing process may include chemically removing the surface defects from the semiconductor substrate 100. In the case where such a chemical-based curing process is used, a buffer insulating layer (not shown) may be formed on the bottom surface of the semiconductor substrate 100 while the surface defects are removed from the bottom surface of the semiconductor substrate 100.

In the case where the thinning process is performed so that only the p-type epitaxial layer 103 remains of the semiconductor substrate 100, a highly-doped p-type layer (not shown) may be formed on the bottom surface of the p-type epitaxial layer 103. The presence of the highly-doped p-type layer may facilitate reducing a dark current, which may be produced by surface defects of the p-type epitaxial layer 103.

Subsequently, the optically-transparent layer 170 may be formed on the bottom surface of the semiconductor substrate 100, as shown in FIG. 11. For example, the formation of the optically-transparent layer 170 may include forming the planarization layer 171, the first optical filter layer 173, and the second optical filter layer 175.

The planarization layer 171 may be formed of a material whose refractive index is higher than that of silicon oxide, and this facilitate improving the light sensitivity of the image sensor. For example, the planarization layer 171 may be formed of a material having a refractive index ranging from about 1.4 to about 4.0. For example, the planarization layer 171 may be formed of $Al_2O_3$, $CeF_3$, $HfO_2$, ITO, MgO, $Ta_2O_5$, $TiO_2$, $ZrO_2$, Si, Ge, ZnSe, ZnS or $PbF_2$. In another case, the planarization layer 171 may be formed of an organic material with a high refractive index, for example, siloxane resin, benzocyclobutene (BCB), polyimide materials, acrylic materials, parylene C, poly (methyl methacrylate) (PMMA), or polyethylene terephthalate (PET).

The first optical filter layer 173 may be formed on the planarization layer 171 of the color pixel region $P_C$. The first optical filter layer 173 may include color filters that selectively allow visible light to propagate toward the first photoelectric conversion layer 110a. For example, the first optical filter layer 173 may include color filters configured to realize red, green, and blue colors. Alternatively, the first optical filter layer 173 may include color filters configured to realize other colors (e.g., cyan, magenta, or yellow). The color filters may be formed of or include photoresist patterns, which are dyed to have colors corresponding to color pixels, respectively.

The second optical filter layer 175 may be formed on the planarization layer 171 of the depth pixel region $P_Z$. The second optical filter layer 175 may include a material selectively allowing infrared light to propagate toward the second photoelectric conversion layer 110b. In addition, although not shown, micro lenses may be formed on the first and second optical filter layers 173 and 175.

Figure 28:
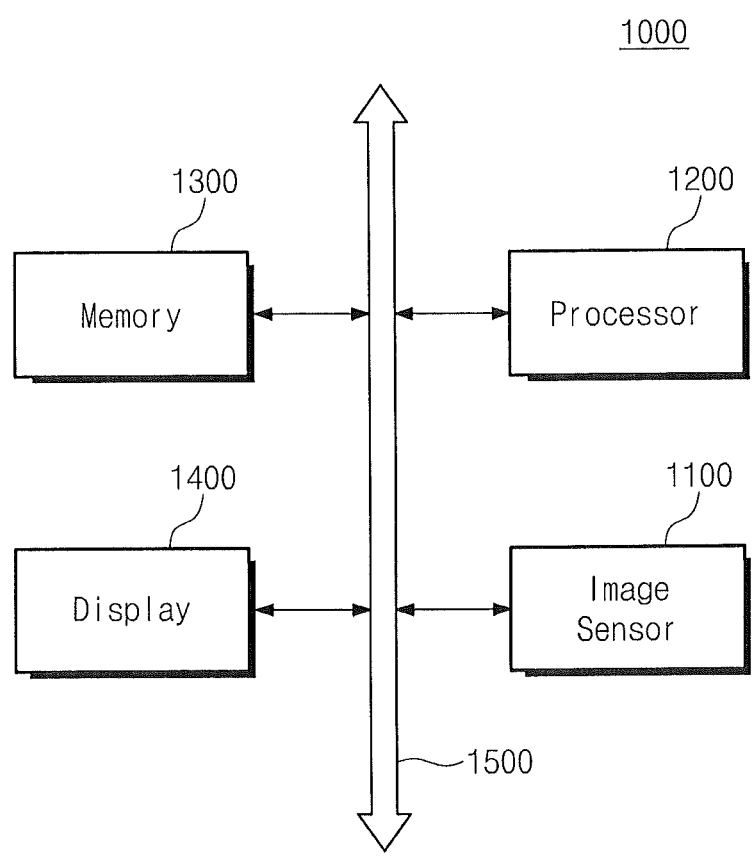
FIG. 28 is a block diagram illustrating an electronic device with an image sensor according to example embodiments of the inventive concepts.

FIG. 28 is a block diagram illustrating an electronic device with an image sensor according to example embodiments of the inventive concepts. The electronic device may be, for example, one of digital cameras or mobile devices.

Referring to FIG. 28, an electronic device 1000 may include an image sensor 1100, a processor 1200, a memory 1300, a display 1400, and a bus 1500. As shown in FIG. 28, the image sensor 1100 may capture external images in response to control signals of the processor 1200. The processor 1200 may store the captured image information in the memory 1300 through the bus 1500. The processor 1200 may output the image stored in the memory 1300 to display the image on the display 1400.

The electronic device 1000 may include computer systems, camera systems, scanners, machined watch systems, navigation systems, videophones, monitoring systems, automatic focus systems, tracking systems, motion monitoring systems, and image stabilization systems, but is not limited thereto. Further, in the case where electronic device 1000 is applied to a mobile device, a battery may be further provided to supply operating power to the mobile device.

Figure 29:
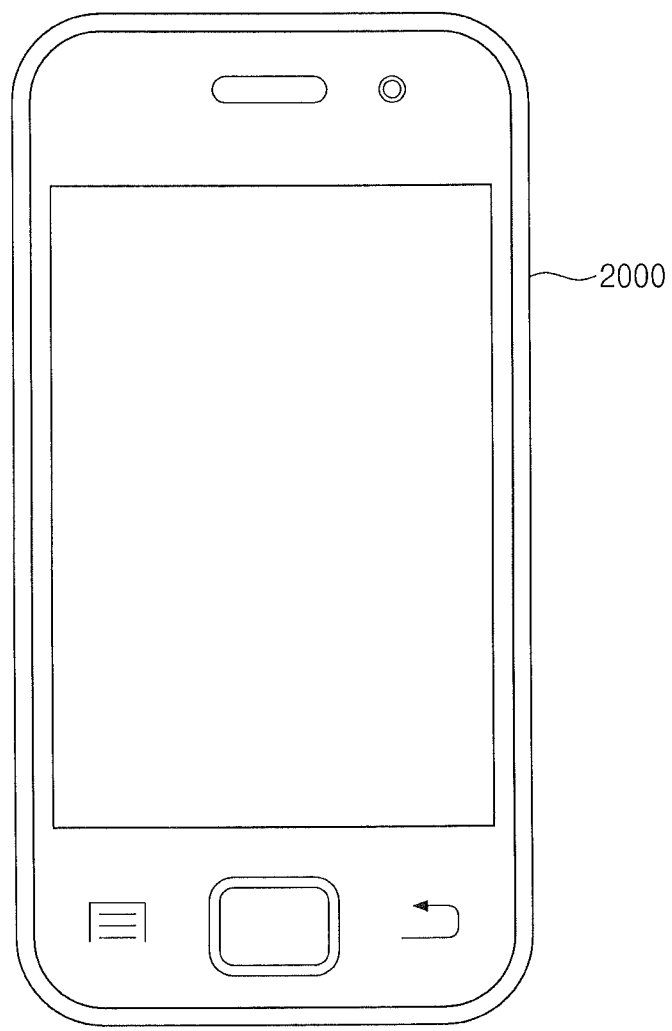
FIG. 29 is a schematic diagram illustrating an electronic product with an image sensor according to example embodiments of the inventive concepts.

FIG. 29 is a diagram showing an example of an electronic device with an image sensor according to example embodiments of the inventive concepts. As shown in FIG. 29, the image sensor according to example embodiments of the inventive concepts may be applied to realize a mobile phone 2000. Alternatively, the image sensor may be used to realize a smart phone, a personal digital assistant (PDA), a portable multimedia player (PMP), a digital multimedia broadcast (DMB) device, a global positioning system (GPS), a handheld gaming console, a portable computer, a web tablet, a wireless phone, a digital music player, a memory card, or other electronic products, which may be configured to receive or transmit data wirelessly.

According to example embodiments of the inventive concepts, image sensors are provided that sense light reflected from an object and realize a three-dimensional image of the object therefrom. In the image sensor, first and second transfer gate electrodes may be disposed in a trench of a semiconductor substrate between first and second charge-detection layers. The first and second charge-detection layers may have bottom surfaces that are vertically spaced apart from those of the first and second transfer gate electrodes. Accordingly, in operation of the image sensor, it is possible to selectively enhance an electric field induced by applying a high voltage to the first transfer gate electrode while suppressing another electric field induced by application of the static voltage to the second charge-detection layer during an operation in which electric charges from the first charge-detection layer are detected. In other words, it is possible to suppress charges from being mixed by the electric fields induced by the transfer gate electrodes and the charge-detection layers in the operation of detecting electric charges from the first and second charge-detection layers. As a result, it is possible to improve exactness of three-dimensional images (e.g., DC property of the depth pixel) of the image sensor.

The first and second transfer gate electrodes are provided in a trench in the above-described embodiments. It will be appreciated that in other embodiments the trench may comprise a first trench and a second trench, and the first transfer gate electrode may be in the first trench and the second transfer gate electrode may be in the second trench.

While example embodiments of the inventive concepts have been particularly shown and described, it will be understood by one of ordinary skill in the art that variations in form and detail may be made therein without departing from the spirit and scope of the attached claims.

What is claimed is:

1. An image sensor, comprising:
a semiconductor substrate including a trench, the semiconductor substrate having a first conductivity type;
a photoelectric conversion layer in the semiconductor substrate below the trench, the photoelectric conversion layer having a second conductivity type that is opposite the first conductivity type;
first and second transfer gate electrodes that are each at least partly in the trench;
a gate insulating layer that is at least partly in the trench and that is interposed between the first and second transfer gate electrodes and the photoelectric conversion layer;
a first charge-detection layer in the semiconductor substrate adjacent to the first transfer gate electrode; and
a second charge-detection layer in the semiconductor substrate adjacent to the second transfer gate electrode,
wherein bottom surfaces of the respective first and second transfer gate electrodes are below the top surface of the semiconductor substrate.

2. The image sensor of claim 1, wherein the trench is in a top surface of the semiconductor substrate, and wherein the bottom surfaces of the first and second transfer gate electrodes are closer to a bottom surface of the semiconductor substrate than are bottom surfaces of the first and second charge-detection layers.

3. The image sensor of claim 1, wherein the trench extends vertically into the semiconductor substrate, and wherein the first and second transfer gate electrodes extend further through the semiconductor substrate in the vertical direction than do the first and second charge-detection layers.

4. The image sensor of claim 1, wherein the first and second transfer gate electrodes overlap the photoelectric conversion layer, in a plan view.

5. The image sensor of claim 1, wherein a space between the first and second transfer gate electrodes is smaller than a width of the first transfer gate electrode.

6. The image sensor of claim 1, wherein the trench is in a top surface of the semiconductor substrate, the image sensor further comprising:
an interconnection layer on the top surface of the semiconductor substrate, the interconnection layer including a plurality of wires; and
an optical filter layer provided on a bottom surface of the semiconductor substrate.

7. An image sensor, comprising:
a semiconductor substrate having a first conductivity type, the semiconductor substrate including a color pixel region and a depth pixel region;
a first photoelectric conversion layer in the color pixel region of the semiconductor substrate, the first photoelectric conversion layer having a second conductivity type that is opposite the first conductivity type;
a color pixel transfer gate electrode on the first photoelectric conversion layer;
a second photoelectric conversion layer in the depth pixel region of the semiconductor substrate, the second photoelectric conversion layer having the second conductivity type;
first and second depth pixel transfer gate electrodes on the second photoelectric conversion layer;
a first charge-detection layer in the semiconductor substrate on a side of the first depth pixel transfer gate electrode that is opposite the second depth pixel transfer gate electrode; and
a second charge-detection layer on a side of the second depth pixel transfer gate electrode that is opposite the first depth pixel transfer gate electrode,
wherein the color pixel transfer gate electrode is at least partly in a first trench in a top surface of the semiconductor substrate and at least one of the first and second depth pixel transfer gate electrodes is at least partly in a second trench in the top surface of the semiconductor substrate.

8. The image sensor of claim 7, wherein bottom surfaces of the first and second charge-detection layers are closer to the top surface of the semiconductor substrate than are bottom surfaces of the first and second depth pixel transfer gate electrodes.

9. The image sensor of claim 7, wherein the color pixel transfer gate electrode has a top surface that is substantially coplanar with top surfaces of the first and second depth pixel transfer gate electrodes.

10. The image sensor of claim 7, wherein the color pixel transfer gate electrode is disposed above and covers a central region of the first photoelectric conversion layer.

11. The image sensor of claim 10, further comprising a charge-detection layer in the semiconductor substrate at a side of the color pixel transfer gate electrode, the charge-detection layer having the second conductivity type.

12. The image sensor of claim 7, wherein the first and second depth pixel transfer gate electrodes are disposed above and at least partially cover the second photoelectric conversion layer.

13. The image sensor of claim 7, wherein a distance between the first and second depth pixel transfer gate electrodes is smaller than a width of the first depth pixel transfer gate electrode.

14. The image sensor of claim 7, wherein a width of the color pixel transfer gate electrode is smaller than widths of each of the first and second depth pixel transfer gate electrodes.

15. The image sensor of claim 7, wherein a first vertical depth of the first photoelectric conversion layer is different than a second vertical depth of the second photoelectric conversion layer.

16. The image sensor of claim 7, further comprising,
an interconnection layer on the top surface of the semiconductor substrate, the interconnection layer including a plurality of vertically-stacked wires; and
an optical filter layer on the bottom surface of the semiconductor substrate.

17. The image sensor of claim 16, wherein the optical filter layer comprises:
a first optical filter layer that passes visible light on the color pixel region; and
a second optical filter layer that passes infrared light on the depth pixel region.

18. An image sensor system, comprising:
a light source that is configured to emit light toward an object;
an image sensor that is configured to sense light reflected from the object; and
a timing controller that is configured to provide synchronized pulse signals to the light source and the image sensor,
wherein the image sensor comprises:
a semiconductor substrate having a trench in a top surface thereof;

first and second transfer gate electrodes in the trench;

a photoelectric conversion layer in the semiconductor substrate below the first and second transfer gate electrodes;

a first charge-detection layer in the semiconductor substrate adjacent the first transfer gate electrode; and a second charge-detection layer in the semiconductor substrate adjacent the second transfer gate electrode, wherein bottom surfaces of the respective first and second transfer gate electrodes are below the top surface of the semiconductor substrate.

19. The image sensor system of claim 18, wherein the timing controller is configured to provide first and second pulse signals, which have a phase difference of 180 degrees, to the first and second transfer gate electrodes, respectively, and the image sensor system is configured to calculate a distance from the light source to the object, based on a difference in electric potential between the first and second charge-detection layers.

20. The image sensor system of claim 19, wherein the image sensor is configured so that electric fields induced by the first and second transfer gate electrodes are separated from each other, when first and second transfer signals are applied thereto.

* * * * *